(12) United States Patent
Liao et al.

(10) Patent No.: US 11,075,279 B2
(45) Date of Patent: Jul. 27, 2021

(54) METAL GATE AND CONTACT PLUG DESIGN AND METHOD FORMING SAME

(71) Applicant: Taiwan Semiconductor Manufacturing Company, Ltd., Hsinchu (TW)

(72) Inventors: Chih-Teng Liao, Hsinchu (TW); Yi-Wei Chiu, Kaohsiung (TW); Xi-Zong Chen, Tainan (TW); Chia-Ching Tsai, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/045,175

(22) Filed: Jul. 25, 2018

(65) Prior Publication Data

US 2018/0350947 A1    Dec. 6, 2018

Related U.S. Application Data

(62) Division of application No. 15/429,894, filed on Feb. 10, 2017, now Pat. No. 10,121,873.
(Continued)

(51) Int. Cl.
*H01L 29/66*  (2006.01)
*H01L 23/485* (2006.01)
(Continued)

(52) U.S. Cl.
CPC .. *H01L 29/66545* (2013.01); *H01L 21/28123* (2013.01); *H01L 21/32115* (2013.01);
(Continued)

(58) Field of Classification Search
CPC ....... H01L 21/823475; H01L 21/28123; H01L 21/32115; H01L 21/32137; H01L 21/76897; H01L 23/485; H01L 23/5283; H01L 29/66545; H01L 29/42376; H01L 29/66553; H01L 29/6656; H01L 29/66795; H01L 29/7851; H01L 29/41791; H01L 29/665; H01L 29/165; H01L 23/5386;
(Continued)

(56) References Cited

U.S. PATENT DOCUMENTS 6,759,720 B2 * 7/2004 Shinkawata ...... H01L 21/76897
257/300
7,667,271 B2    2/2010 Yu et al.
(Continued)

FOREIGN PATENT DOCUMENTS

KR    20140104890 A    8/2014

*Primary Examiner* — Bitew A Dinke
(74) *Attorney, Agent, or Firm* — Slater Matsil, LLP

(57) ABSTRACT

A method includes forming a dummy gate stack over a semiconductor region, forming a gate spacer on a sidewall of the dummy gate stack, removing the dummy gate stack to form an opening, forming a replacement gate stack in the opening, recessing the replacement gate stack to form a recess, filling the recess with a conductive material, and performing a planarization to remove excess portions of the conductive material over the gate spacer. A remaining portion of the conductive material forms a gate contact plug. A top portion of the gate contact plug is at a same level as a top portion of the first gate spacer.

20 Claims, 26 Drawing Sheets

Related U.S. Application Data

(60) Provisional application No. 62/368,505, filed on Jul. 29, 2016.

(51) Int. Cl.
*H01L 29/423* (2006.01)
*H01L 21/28* (2006.01)
*H01L 21/321* (2006.01)
*H01L 21/3213* (2006.01)
*H01L 21/768* (2006.01)
*H01L 23/528* (2006.01)
*H01L 29/78* (2006.01)
*H01L 29/165* (2006.01)
*H01L 29/417* (2006.01)

(52) U.S. Cl.
CPC .. *H01L 21/32137* (2013.01); *H01L 21/76897* (2013.01); *H01L 23/485* (2013.01); *H01L 23/5283* (2013.01); *H01L 29/42376* (2013.01); *H01L 29/6656* (2013.01); *H01L 29/66553* (2013.01); *H01L 29/66795* (2013.01); *H01L 29/7851* (2013.01); *H01L 29/165* (2013.01); *H01L 29/41791* (2013.01); *H01L 29/665* (2013.01)

(58) Field of Classification Search
CPC .......... H01L 29/785; H01L 2029/7858; H01L 21/0274; H01L 29/41725; H01L 29/66348; H01L 29/66621
See application file for complete search history.

(56) References Cited

U.S. PATENT DOCUMENTS

| | | | |
|---|---|---|---|
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,178,035 B1 | 11/2015 | Sung et al. | |
| 9,490,317 B1* | 11/2016 | Labonte | H01L 29/78 |
| 9,496,361 B1* | 11/2016 | Tung | H01L 29/4958 |
| 9,698,232 B2 | 7/2017 | Yang et al. | |
| 9,865,697 B1* | 1/2018 | Hsueh | H01L 29/4966 |
| 9,929,271 B2* | 3/2018 | Chang | H01L 21/3065 |
| 9,966,454 B2* | 5/2018 | Basker | H01L 29/665 |
| 10,141,225 B2* | 11/2018 | Tsai | H01L 21/76889 |
| 2003/0235948 A1* | 12/2003 | Park | H01L 21/76897 438/253 |
| 2006/0094250 A1* | 5/2006 | Lee | H01L 21/76814 438/758 |
| 2007/0099414 A1* | 5/2007 | Frohberg | H01L 21/76877 438/618 |
| 2009/0027964 A1 | 1/2009 | Arai | |
| 2011/0042752 A1* | 2/2011 | Mayuzumi | H01L 21/28518 257/369 |
| 2011/0108928 A1* | 5/2011 | Tao | H01L 21/3215 257/410 |
| 2012/0139062 A1 | 6/2012 | Yuan et al. | |
| 2012/0187460 A1 | 6/2012 | Lavoie et al. | |
| 2012/0273901 A1* | 11/2012 | Yin | H01L 29/49 257/410 |
| 2013/0082337 A1* | 4/2013 | Chudzik | H01L 29/517 257/410 |
| 2013/0234254 A1* | 9/2013 | Ng | H01L 21/823857 257/369 |
| 2013/0248985 A1 | 9/2013 | Amarnath et al. | |
| 2013/0295734 A1* | 11/2013 | Niebojewski | H01L 29/66477 438/197 |
| 2014/0001574 A1 | 1/2014 | Chen et al. | |
| 2014/0027822 A1* | 1/2014 | Su | H01L 29/4966 257/288 |
| 2014/0103404 A1* | 4/2014 | Li | H01L 21/823842 257/288 |
| 2014/0110755 A1 | 4/2014 | Colinge | |
| 2014/0117420 A1* | 5/2014 | Chen | H01L 23/485 257/288 |
| 2014/0151812 A1 | 6/2014 | Liaw | |
| 2014/0154877 A1 | 6/2014 | Besser et al. | |
| 2014/0203333 A1* | 7/2014 | Huang | H01L 29/66545 257/288 |
| 2014/0231885 A1 | 8/2014 | Xie et al. | |
| 2014/0361376 A1* | 12/2014 | Lii | H01L 21/28518 257/369 |
| 2015/0014788 A1* | 1/2015 | Park | H01L 29/66545 257/401 |
| 2015/0021672 A1* | 1/2015 | Chuang | H01L 21/823821 257/288 |
| 2015/0079774 A1* | 3/2015 | Chang | H01L 21/31053 438/586 |
| 2015/0228646 A1* | 8/2015 | Ho | H01L 27/088 257/392 |
| 2015/0235948 A1* | 8/2015 | Song | H01L 23/5283 257/368 |
| 2015/0270359 A1* | 9/2015 | Basker | H01L 21/76831 438/151 |
| 2015/0270366 A1 | 9/2015 | Purayath et al. | |
| 2015/0340488 A1 | 11/2015 | Leobandung et al. | |
| 2015/0364371 A1* | 12/2015 | Yen | H01L 21/823475 257/401 |
| 2016/0005731 A1* | 1/2016 | Chen | H01L 27/0629 257/300 |
| 2016/0104704 A1* | 4/2016 | Fang | H01L 29/4966 257/392 |
| 2016/0211139 A1* | 7/2016 | Ko | H01L 29/0847 |
| 2016/0276158 A1* | 9/2016 | Hsiao | H01L 21/28114 |
| 2016/0276455 A1* | 9/2016 | Yang | H01L 29/0649 |
| 2016/0307758 A1 | 10/2016 | Li et al. | |
| 2016/0308012 A1* | 10/2016 | Song | H01L 21/823456 |
| 2017/0069757 A1* | 3/2017 | Peng | H01L 29/66795 |
| 2017/0077097 A1* | 3/2017 | Dong | H01L 23/535 |
| 2017/0077257 A1* | 3/2017 | Hung | H01L 29/4966 |
| 2017/0162396 A1* | 6/2017 | Tsai | H01L 21/28247 |
| 2017/0162675 A1* | 6/2017 | Yim | H01L 21/0217 |
| 2017/0236821 A1* | 8/2017 | Kim | H01L 27/088 257/401 |
| 2019/0103311 A1* | 4/2019 | Tsai | H01L 21/76889 |

* cited by examiner

METAL GATE AND CONTACT PLUG DESIGN AND METHOD FORMING SAME

PRIORITY CLAIM AND CROSS-REFERENCE

This application is a divisional of U.S. patent application Ser. No. 15/429,894, filed Feb. 10, 2017, and entitled "Metal Gate and Contact Plug Design and Method Forming Same," which claims the benefit of the following provisionally filed U.S. Patent application: Application Ser. No. 62/368,505, filed Jul. 29, 2016, and entitled "Metal Gate and Contact Plug Design and Method Forming Same," which applications are hereby incorporated herein by reference.

BACKGROUND

With the sizes of the integrated circuits becoming increasingly smaller, the respective formation processes also become increasingly more difficult, and problems may occur where conventionally no problems will occur. For example, in the formation of Fin Field-Effect Transistors (FinFETs), the metal gates and the adjacent source and drain regions may be electrically shorted to each other. The contact plugs of metal gates may also be shorted to the adjacent contact plugs of source and drain regions.

In addition, the formation of FinFETs may involve the formation of dummy polysilicon gates, removing the dummy polysilicon gates in subsequent processes, and filling the recesses left by the dummy polysilicon gates with replacement metal gates. However, since the dummy polysilicon gates become very narrow, polysilicon residue may be left due to the incomplete removal of the dummy polysilicon gates, causing the degradation of the performance of the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
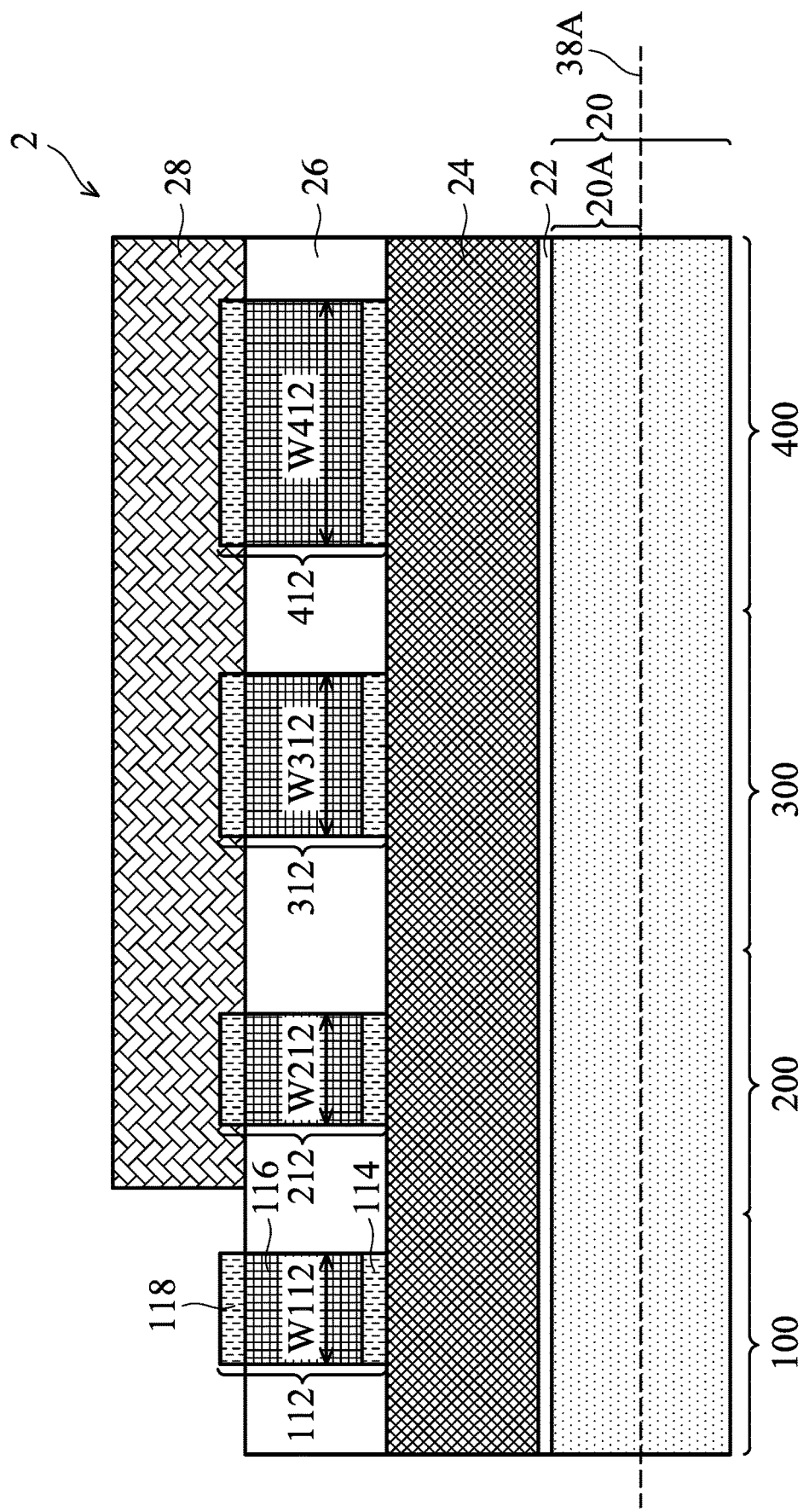
FIGS. 1 through 23 illustrate the cross-sectional views of intermediate stages in the formation of transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor with metal gates and contact plugs and the method of forming the same are provided in accordance with various exemplary embodiments. The intermediate stages of forming the transistor and the metal gates and contact plugs are illustrated in accordance with some embodiments. Some variations of some embodiments are discussed. Throughout the various views and illustrative embodiments, like reference numbers are used to designate like elements.

FIGS. 1 through 23 illustrate the cross-sectional views of intermediate stages in the formation of a transistor in accordance with some embodiments of the present disclosure. The steps shown in FIGS. 1 through 23 are also reflected schematically in the process flow 500 shown in FIG. 24. The illustrative embodiments use the formation of a Fin Field-Effect Transistor (FinFET) as an example. The concept of the present disclosure is readily applicable to planar transistors.

Referring to FIG. 1, semiconductor substrate 20, which is a part of semiconductor wafer 2, is provided. In accordance with some embodiments of the present disclosure, semiconductor substrate 20 includes a crystalline silicon. Other commonly used materials such as carbon, germanium, gallium, boron, arsenic, nitrogen, indium, phosphorus, and/or the like, may also be included in semiconductor substrate 20. Substrate 20 may also be a compound substrate including a III-V compound semiconductor or silicon germanium.

Semiconductor substrate 20 includes portions in a plurality of regions in which different types of transistors are to be formed. In accordance with some embodiments, the plurality of regions includes standard device region 100, High-Voltage (HV) device region 200, long-channel device region 300, and Input-Output (IO) device region 400. Standard device region 100 may be used for forming core/logic transistors. HV device region 200 may be used for forming HV transistors. Long-channel device region 300 may be used for forming transistor having long channels, and IO device region 400 may be used for forming IO transistors. The core transistors may be supplied with a low positive power supply voltage, for example, lower than about 1.0 volt. The HV transistor may be supplied with, and are configured to endure, a high positive power supply voltage higher than the positive power supply voltage of the devices in device region 100. For example, the power supply voltages of the HV device regions 200 may be between about 1.5V and about 3.3V.

Figure 5A:
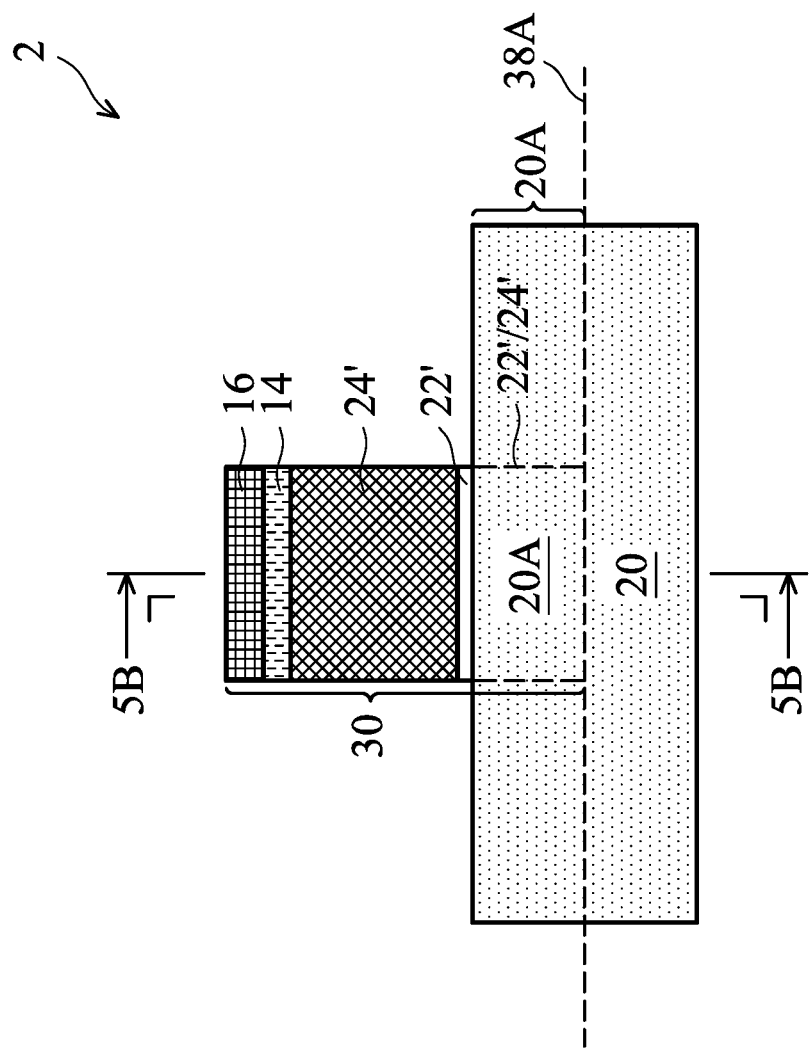
Figure 5B:
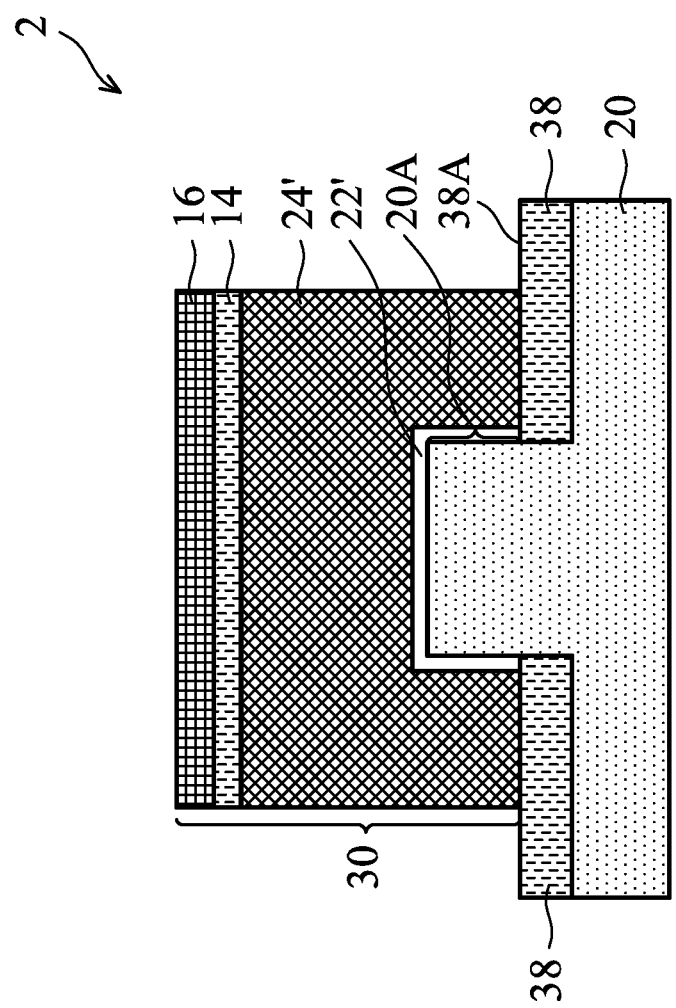

In accordance with some embodiments of the present disclosure, substrate 20 includes semiconductor fin(s) 20A, which are the portions over adjacent isolation regions. An exemplary fin 20A is shown in FIG. 5B, which illustrates that semiconductor fin 20A is higher than the adjacent isolation regions 38, which may be Shallow Trench Isolation (STI) regions. It is noted that although for simplicity, the fins in regions 100, 200, 300, and 400 are illustrated as connected to each other, in reality, the fins in different device regions are separate from each other.

Referring back to FIG. 1, dummy gate dielectric 22 is formed over substrate 20. Dummy gate dielectric 22 may be formed of silicon oxide. Dummy gate electrode 24 is formed over dummy gate dielectric 22, and may be formed of polysilicon in accordance with some embodiments.

Mask stacks 112, 212, 312, and 412 are formed in device regions 100, 200, 300, and 400, respectively, and have widths W112, W212, W312, and W412, respectively, with the relationship W412>W312>W212>W112 in accordance with some exemplary embodiments. Mask stack 112 may include layers 114, 116, and 118, which may be formed of silicon oxide, silicon nitride, silicon carbo-nitride, silicon-carbon-oxynitride, or the like. Mask stacks 212, 312, and 412 have the same layers as mask stack 112.

Bottom Anti-Reflective Coating (BARC) 26 is formed over dummy gate electrode 24 and fills the space between mask stacks 112, 212, 312, and 412. In accordance with some embodiments, BARC 26 is formed of a dielectric material such as SiON. BARC 26 may be filled to cover mask stacks 112, 212, 312, and 412, or may have a top surface level with or higher than the top surface of layer 118. Patterned photo resist 28 is formed over BARC 26, and covers mask stacks 212, 312, and 412, leaving mask stack 112 not covered.

Figure 2:
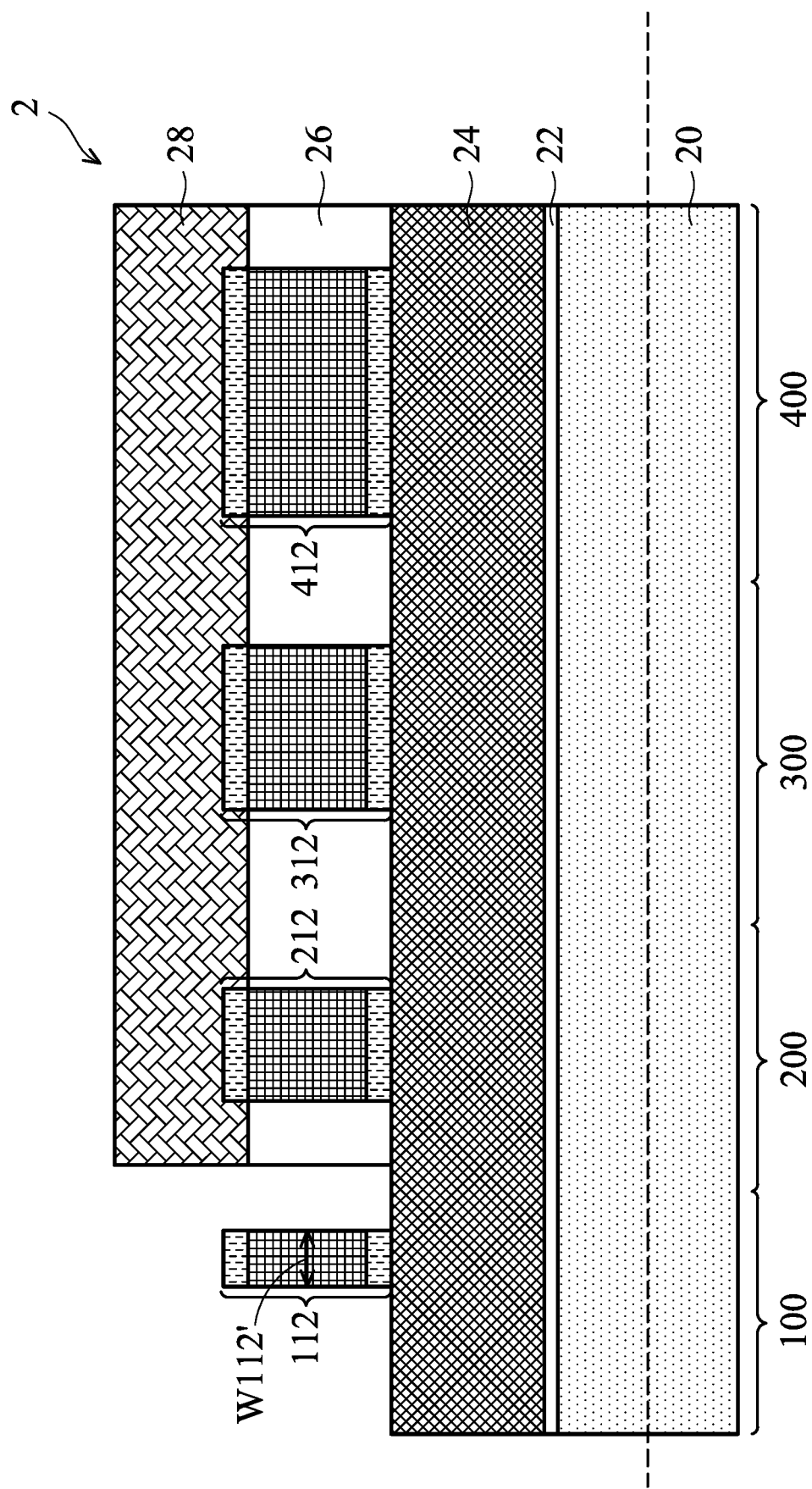

Referring to FIG. 2, BARC 26 is patterned using photo resist 28 as an etching mask. Accordingly, the sidewalls of mask stack 112 are exposed. Next, a trimming step is performed, wherein the trimming is isotropic, and may be a wet etching process or a dry etching process. The respective step is illustrated as step 502 in the process flow shown in FIG. 24. In accordance with some embodiments, the trimming is performed through wet etching process using an etching solution including HF, de-ionized water, $NH_4OH$, $H_2O_2$, Isopropanol (IPA). Alternatively, the trimming is performed through a dry etching process using an etching gas including HBr, $SO_2$, or $CF_4$. As a result of the trimming, mask stack 112 has width W112', which is smaller than about 0.9×W112 in accordance with some embodiments.

Figure 3:
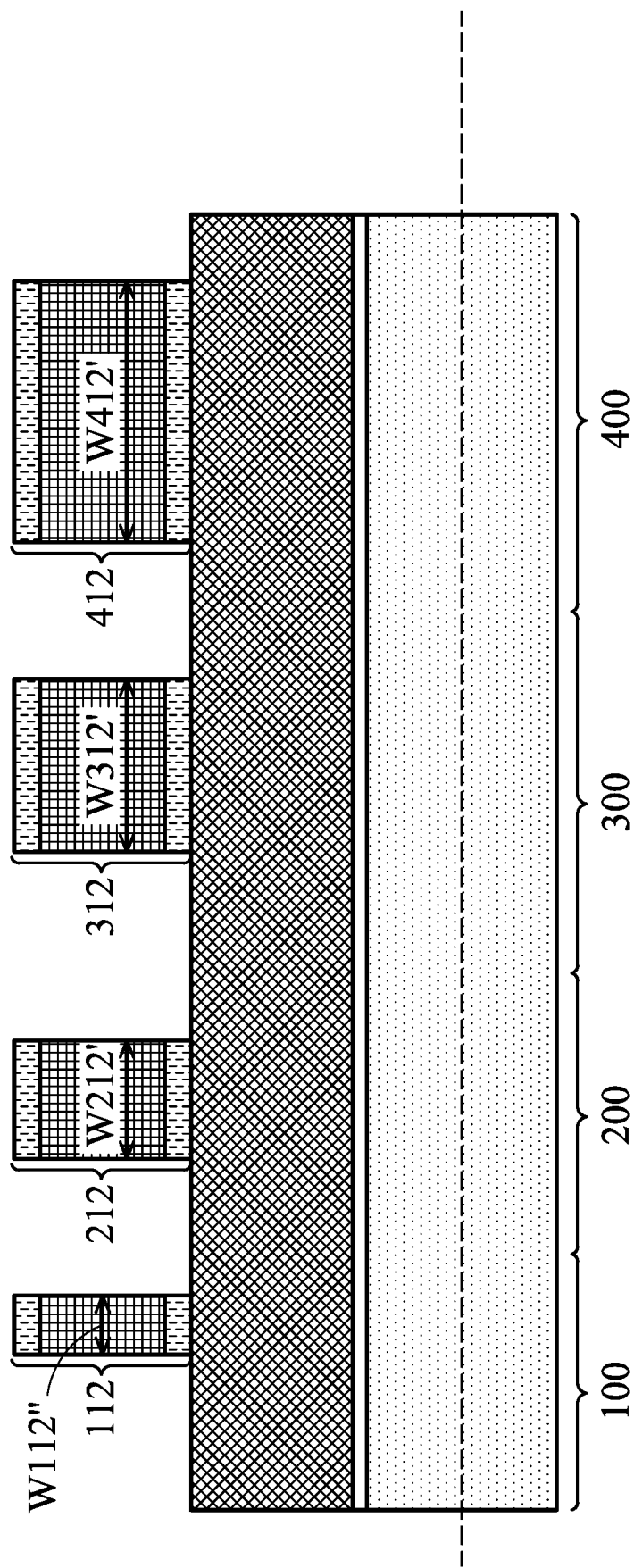

Next, BARC 26 and photo resist 28 are removed, as shown in FIG. 3. Another trimming process may be performed to further trim the widths of mask stacks 112, 212, 312, and 412 using isotropic etching. The respective step is also illustrated as step 502 in the process flow shown in FIG. 24. The etchant may be the same as (or different from) the etchant used in the trimming as shown in FIG. 2. As a result, width W112", W212', W312', and W412' are smaller than about 90 percent of widths W112', W212, W312, and W412, respectively, as shown in FIG. 2.

Figure 4:
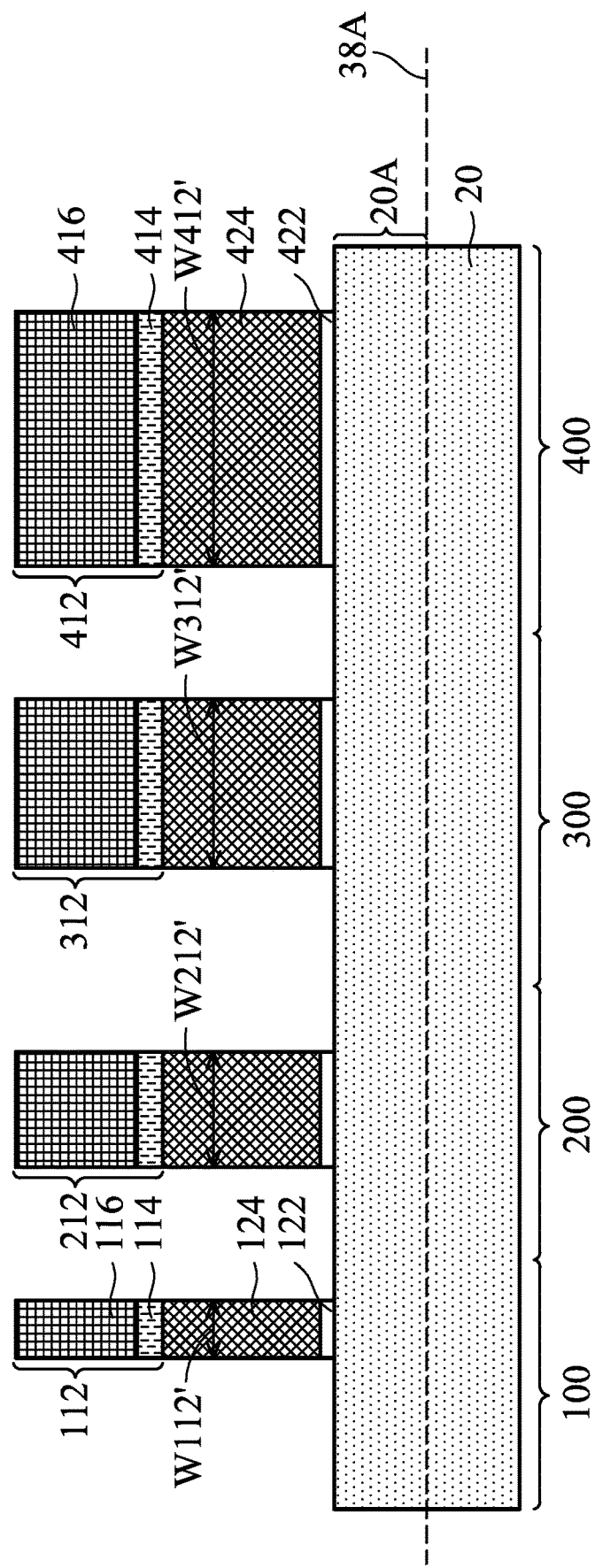

Referring to FIG. 4, dummy gate electrode layer 24 and dummy gate dielectric 22 (FIG. 3) are etched using mask stacks 112, 212, 312, and 412 as an etching mask. The remaining portions of the etched dummy gate electrode layer 24 are dummy gate electrodes 124, 224, 324, and 424. The remaining portions of the etched dummy gate dielectric 22 are dummy gate dielectrics 122, 222, 322, and 422, respectively. The respective step is illustrated as step 504 in the process flow shown in FIG. 24. During this step, dummy gate dielectric layer 22 (FIG. 3) is etched through, and semiconductor fin 20A is exposed. The sidewalls of dummy gate dielectrics 122, 222, 322, and 422 are also exposed. Mask layers 118 as shown in FIG. 3 may be consumed.

Through the process as shown in FIGS. 1 through 4, the widths of dummy gate electrodes 124, 224, 324, and 424 are adjusted and shrunk to desirable values, which results in the advantageous reduction of the Critical Dimension (CD, the gate width) of the resulting transistors, particularly the standard transistors and HV transistors. In accordance with some embodiments of the present disclosure, the widths of gate electrodes 124, 224, 324, and 424 may have ratio W112':W212':W312':W412' in the range 1.0:1.0~1.3: 1.3~1.6:4.0~4.5, The subsequently illustrated process steps in FIGS. 5A/5B through 23 show the intermediate steps for forming transistors. The process flow for forming one transistor is illustrated, wherein the process flow may represent the process flow of the standard transistors in device region 100, the HV transistors in device region 200, the long-channel transistors in device region 300, and the IO transistors in device region 400. Accordingly, the components shown in FIG. 5A represent the mask stack and the corresponding underlying dummy gate electrode and dummy gate dielectric as shown in FIG. 4, depending on which type of transistor is to be formed. For example, when a standard transistor is to be formed, the features 22', 24', 14, and 16 in FIG. 5A represent features 122, 124, 114, and 116, respectively, in FIG. 4. Similarly, when an IO transistor is to be formed, the features 22', 24', 14, and 16 in FIG. 5A represent features 422, 424, 414, and 416, respectively, in FIG. 4. As shown in FIG. 5A, dummy gate dielectric 22' and dummy gate electrode 24' have sidewall portions (illustrated using dashed lines) extending on the top surface and sidewalls of semiconductor fin 20A. In subsequent discussion, features 22', 24', 14 and 16 are collectively referred to as dummy gate stack 30.

FIG. 5B illustrates a cross-sectional view of the structure shown in FIG. 5A, wherein the cross-sectional view is obtained from the plane crossing line 5B-5B in FIG. 5A. FIG. 5B illustrates that semiconductor fin 20A protrudes higher than the top surfaces of 38A of STI regions 38, and dummy gate stack 30 extends on the top surface and the sidewalls of semiconductor fin 20A.

Figure 6:
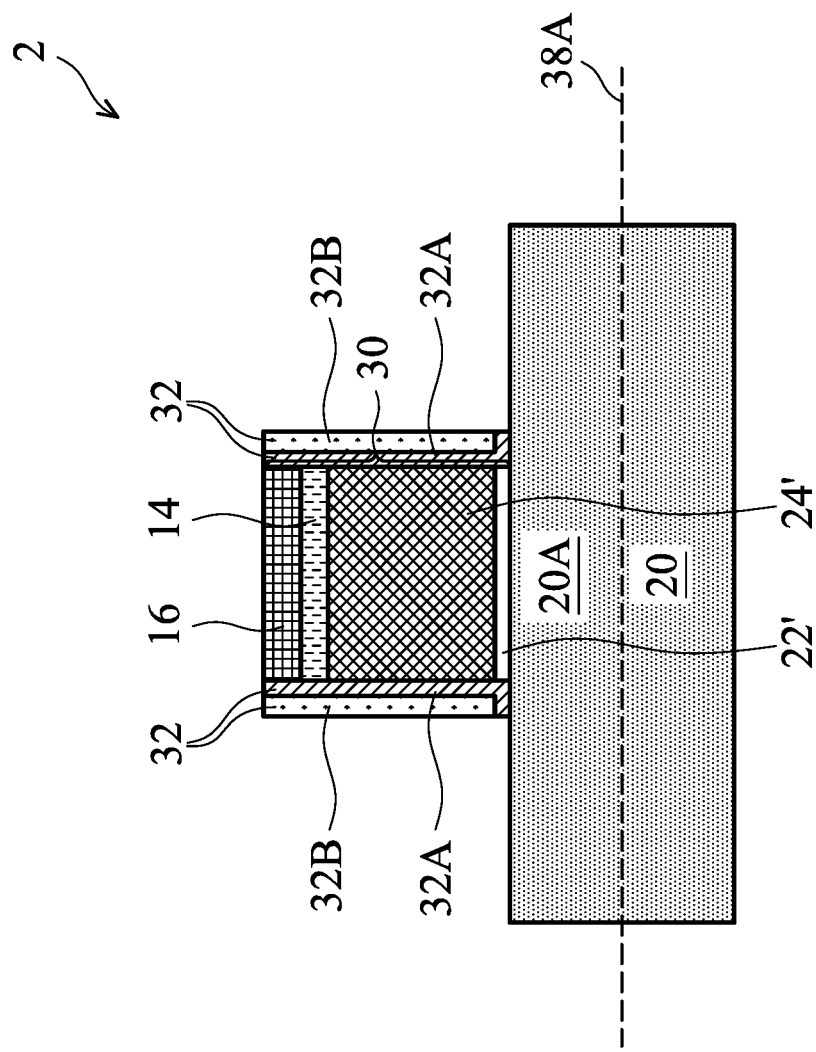

FIG. 6 illustrates the formation of gate spacers 32, which are formed on the sidewalls of dummy gate stack. The respective step is illustrated as step 506 in the process flow shown in FIG. 24. In accordance with some embodiments of the present disclosure, gate spacers 32 include a plurality of layers, for example, layer 32A and layer 32B over layer 32A. Although not shown, more layers may be included in gate spacers 32. The materials of gate spacers 32 include silicon oxide, silicon nitride, silicon oxynitride, silicon carbo-oxynitride, and/or the like. For example, layers 32A and 32B may be formed of the different materials. Alternatively, layers 32A and 32B include same elements (such as silicon and nitrogen) with different compositions (having different percentages). Gate spacers 32 may be in contact with the top surfaces and the sidewalls of semiconductor fin 20A in accordance with some embodiments.

Figure 7:
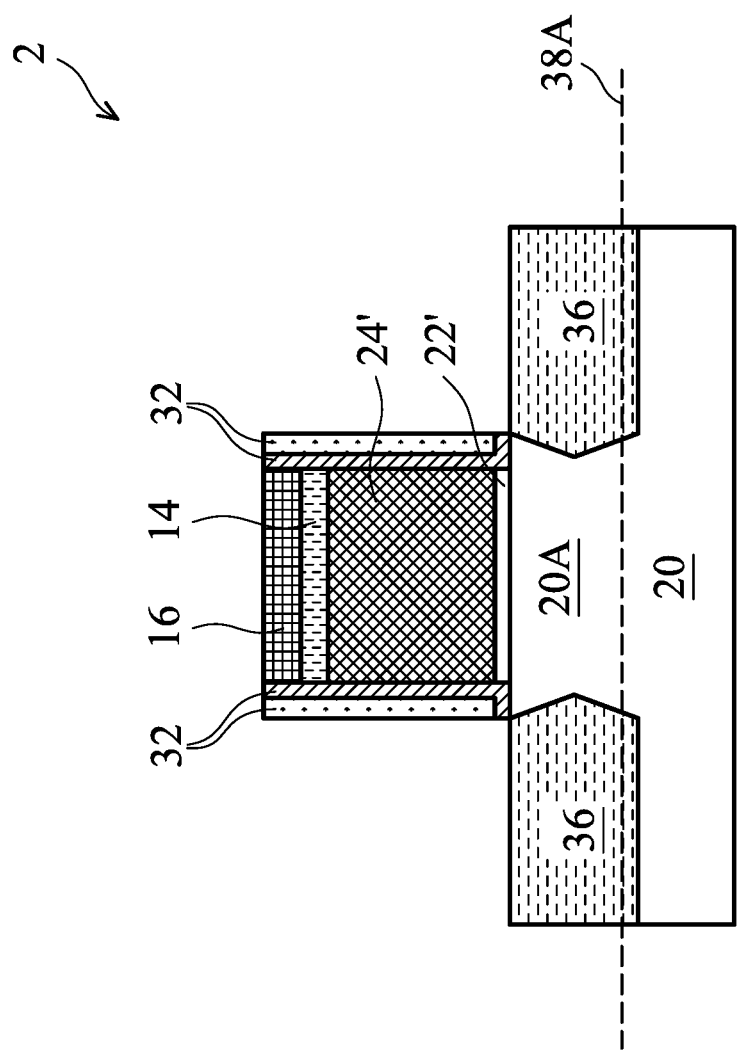

Referring to FIG. 7, source/drain regions 36 are formed. The respective step is illustrated as step 508 in the process flow shown in FIG. 24. In accordance with some embodiments of the present disclosure, the formation of source/drain regions 36 includes etching the portions of the semiconductor fin 20A not covered by dummy gate stack 30 and gate spacers 32, and performing an epitaxy to grow epitaxy regions in the resulting recesses. In accordance with some exemplary embodiments, when an n-type FinFET is to be formed, source/drain regions 36 include silicon phosphorous (SiP) or phosphorous-doped silicon carbon (SiCP). When a p-type FinFET is to be formed, source/drain regions 36 may include SiGe and a p-type impurity such as boron or indium, which may be in-situ doped during the epitaxy. An implantation may or may not be performed to dope an n-type (for an n-type FinFET) or a p-type impurity (for a p-type FinFET) into the epitaxy regions. In accordance with alternative embodiments, the formation of source/drain regions 36 is performed by implanting semiconductor fin 20A.

Figure 8:
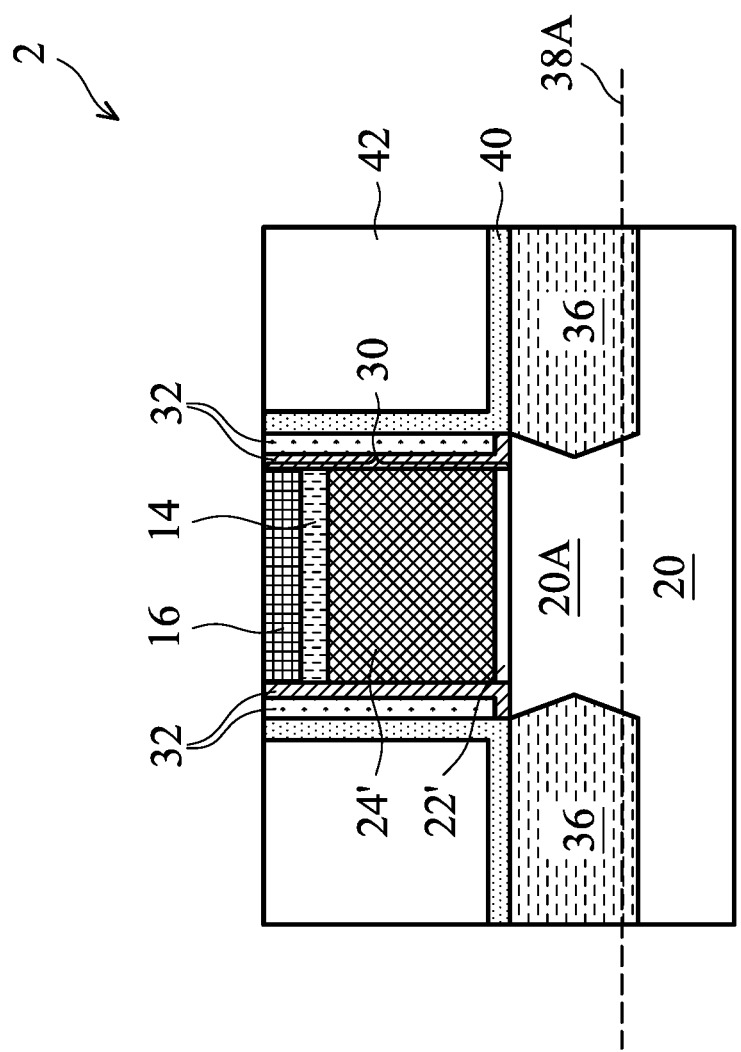

FIG. 8 illustrates the formation of Contact Etch Stop Layer (CESL) 40 and Inter-Layer Dielectric (ILD) 42 over CESL 40. The respective step is illustrated as step 510 in the process flow shown in FIG. 24. In accordance with some embodiments, a buffer oxide layer (not shown) is formed on source and drain regions 36 before the formation of CESL 40. The buffer oxide layer may be formed of silicon oxide, and CESL 40 may be formed of silicon nitride, silicon carbonitride, or the like. The buffer oxide layer and CESL 40 may be formed using Atomic Layer Deposition (ALD), for example. ILD 42 may be formed of a flowable oxide using, for example, Flowable Chemical Vapor Deposition (FCVD). ILD 42 may also include Phospho-Silicate glass (PSG), Boro-Silicate Glass (BSG), Boron-Doped Phospho-Silicate Glass (BPSG), Tetra Ethyl Ortho Silicate (TEOS) oxide, or the like. A planarization such as a Chemical Mechanical Polish (CMP) may be performed to level the top surfaces of dummy gate stack 30, gate spacers 32, CESL 40, and ILD 42.

Figure 9:
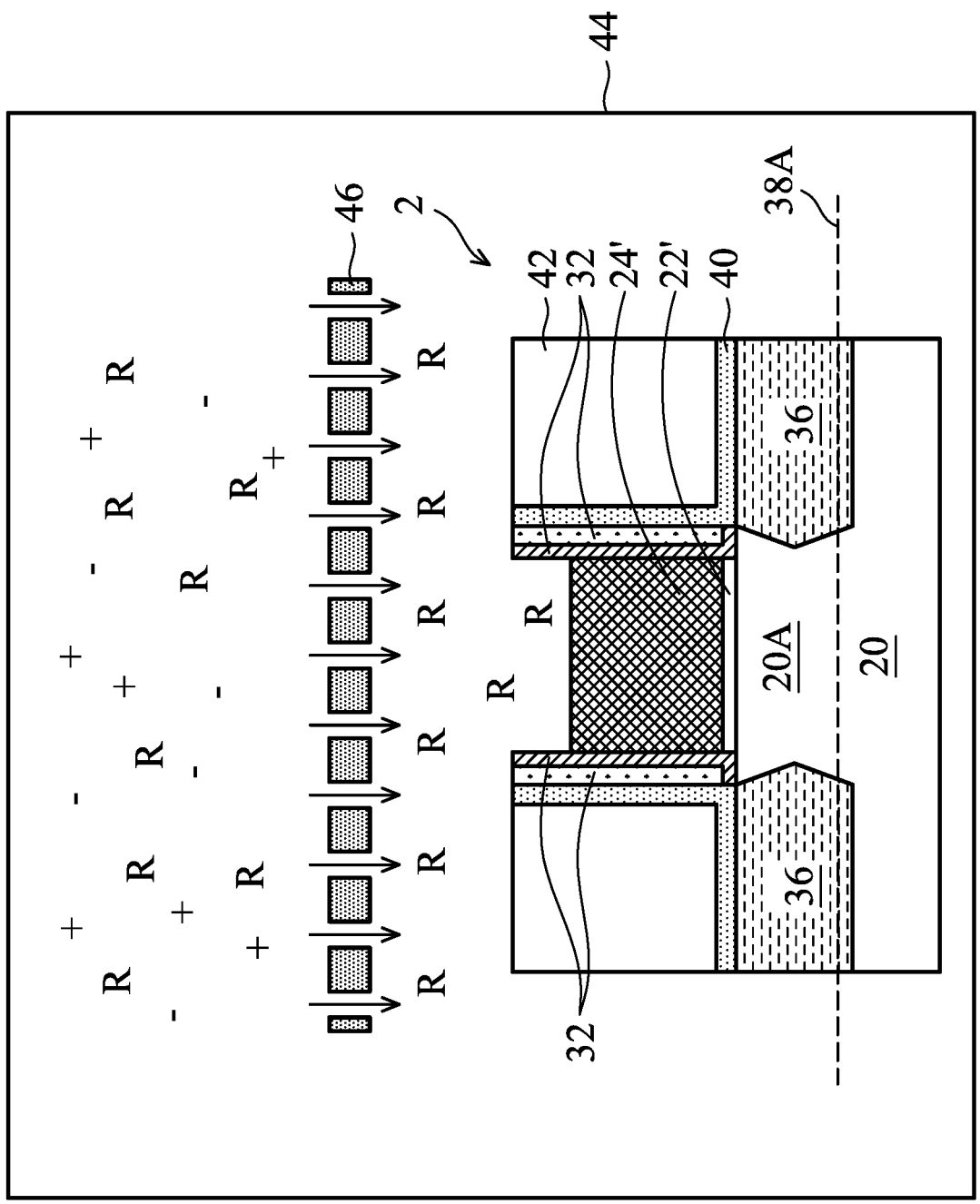
Figure 10:
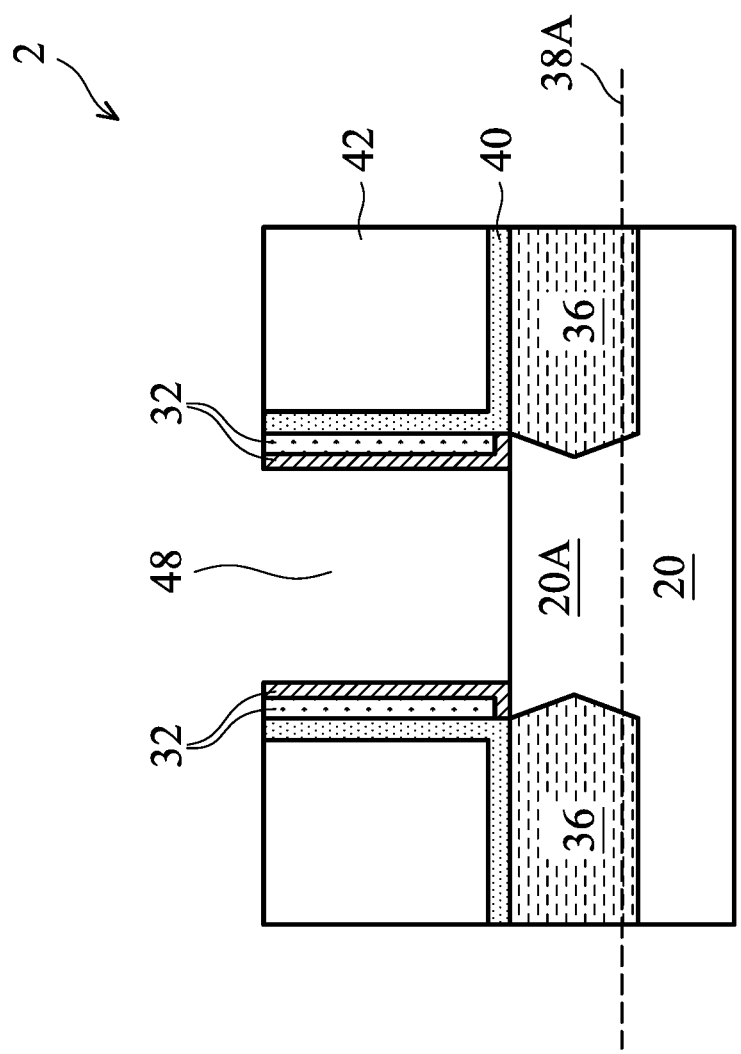

Dummy gate stack 30 is then removed, as shown in FIGS. 9 and 10. The respective step is illustrated as step 512 in the process flow shown in FIG. 24. Mask layers 14 and 16 are first removed, and the resulting structure is shown in FIG. 9. Mask layers 14 and 16 may be removed using, for example, fluorine-containing process gases such as $CF_4/O_2/N_2$, $NF_3/O_2$, $SF_6$, or $SF_6/O_2$, or using $H_3PO_4$ solution. Next, steps are formed to etch an oxide layer, which may be a nature oxide layer, formed on dummy gate electrode 24'. The removal of the oxide may be performed using $NF_3$ and $NH_3$, which react with each other when exposed under RF to form $NH_4F$, which is used to etch silicon oxide (when heated, for example to about 40° C.) to generate $(NH_4)_2SiF_6$ and water. $(NH_4)_2SiF_6$ is solid, and when annealed, for example, at a temperature higher than about 100° C., generates gases $SiF_4$, $NH_3$, and HF, which are evacuated out of chamber 44 by a pump (not shown).

FIG. 9 further illustrates the etching of dummy gate electrode 24' in accordance with some embodiments of the present disclosure. Wafer 2 is placed in chamber 44, and process gases $NF_3$ and $H_2$ are introduced, and plasma is generated from $NF_3$, which reacts with $H_2$ (with plasma generated) to form H (hydrogen) radicals and F (Fluorine) radicals. Ions are also generated from the process gases. FIG. 9 illustrate radicals represented by letter "R," and positive and negative ions by "+" and "−" signs, respectively. Filter 46 (which may be a selectivity modulation device), is used to filter out the ions, while allowing radicals to pass through filter 46 to reach wafer 2. Fluorine radicals react with silicon (dummy gate electrode 24') to generate gaseous $SiH_4$ and $H_2$, which are evacuated out of chamber 44 by a pump (not shown). During the etching of dummy gate electrode 24', fluorine radicals are not directional and don't have bombardment effect. Accordingly, the bottom corner portions of dummy gate electrode 24' are fully etched without leaving residue.

After the removal of dummy gate electrode 24', dummy gate dielectric 22' is removed, for example, using $NF_3/NH_3$ or HF, so that the top surface and sidewalls of semiconductor fin 20A are exposed, and recess 48 is formed, as shown in FIG. 10. Advantageously, no dummy gate dielectric is left directly underlying gate spacers 32 due to the etch-through of dummy gate dielectric layer 22 (FIGS. 2 and 3). Accordingly, no undercut is formed directly under gate spacers 32, wherein the undercut, if formed, may be filled with the subsequently deposited metal for forming replacement gate, and may generate a leakage/shorting path. Hence, the etch-through of dummy gate dielectric layer 22 advantageously removes the leakage/shorting path.

Figure 11:
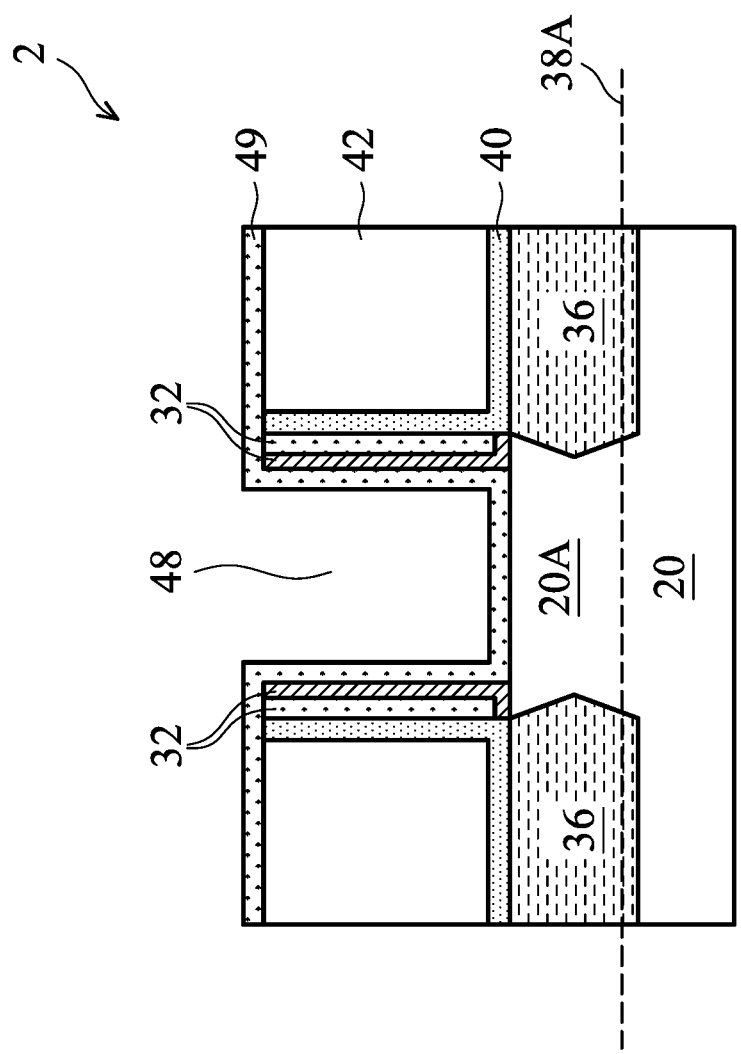
Figure 12:
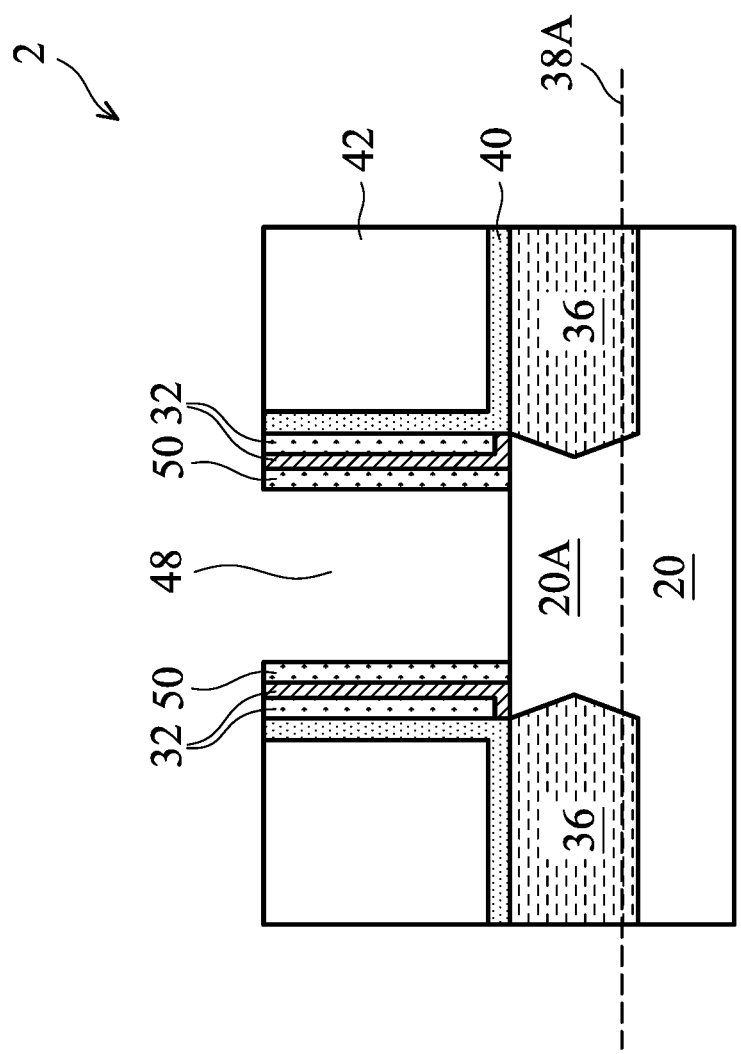

FIGS. 11 and 12 illustrate the formation of gate spacers 50 in accordance with some embodiments. The respective step is illustrated as step 514 in the process flow shown in FIG. 24. In accordance with alternative embodiments, the steps shown in FIGS. 11 and 12 are skipped. Referring to FIG. 11, gate spacer layer 49 is formed, for example, using a conformal deposition method such as ALD or CVD. Accordingly, the thickness of the horizontal portions and vertical portions of gate spacer layer 49 are close to each other, for example, with a difference smaller than about 20 percent or 10 percent of the thickness of the horizontal portions. In accordance with some embodiments of the present disclosure, gate spacer layer is formed of silicon nitride, silicon carbo-nitride, silicon oxynitride, or another dielectric material, which may be different from the materials of gate spacers 32 and the materials of CESL 40 and ILD 42. The formation of gate spacers 50 advantageous separates the subsequently formed metal gate and source/drain regions 36 farther away from each other, and reduces the possibility of leakage and electrical shorting between them.

Referring to FIG. 12, an anisotropic etch is performed to remove the horizontal portions of gate spacer layer 49, leaving gate spacers 50 on the sidewalls of gate spacers 32.

Figure 13A:
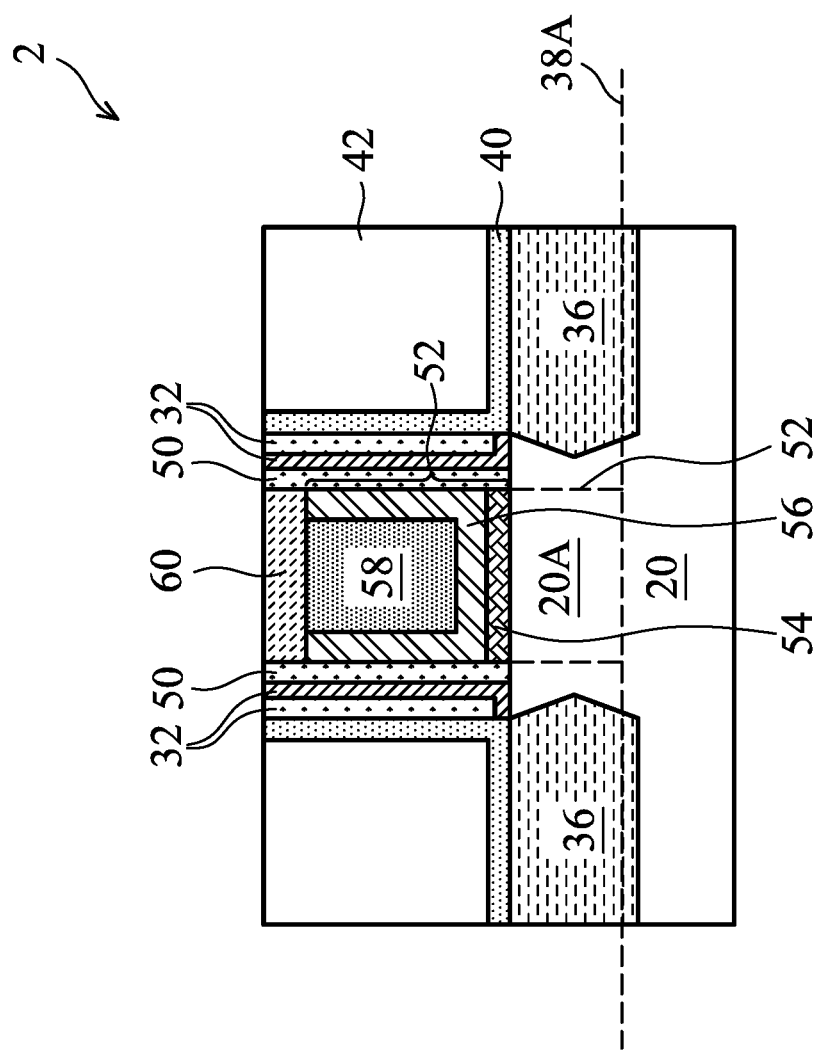

Replacement gate stack 52 is then formed in recess 48, and extends on the top surface and sidewalls of semiconductor fin 20A, as is shown in FIG. 13A. The respective step is illustrated as step 516 in the process flow shown in FIG. 24. Gate stack 52 may include interfacial dielectric layer 54, high-k gate dielectric 56, and replacement gate electrode 58. In accordance with some embodiments of the present disclosure, interfacial dielectric layer 54 is a silicon oxide layer formed through thermal oxidation or chemical oxidation, during which a surface layer of semiconductor fin 20A is oxidized. The high-k dielectric layer 56 may have a k value greater than 7, or greater than 20. Exemplary high-k dielectric materials include hafnium oxide, zirconium oxide, lanthanum oxide, or the like. Replacement gate electrode 58 may be a single-layer formed of a homogeneous conductive material, or may be a composite layer including a plurality of layers formed of TiN, Titanium Silicon Nitride (TSN), TaSiN, WN, TiAl, TiAlN, TaC, TaN, aluminum, tungsten, or combinations thereof. The formation of high-k dielectric layer 56 and gate electrode 58 may include ALD, Physical Vapor Deposition (PVD), Metal-Organic Chemical Vapor Deposition (MOCVD), and/or other applicable methods. A planarization such as CMP is performed to remove excess gate stack 52.

Hard mask 60 is formed over replacement gate stack 52. In accordance with some embodiments of the present disclosure, the planarized gate stack 52 is etched back, and hard mask 60 is formed in the resulting recess left by the etched portion of gate stack 52. The formation of hard mask 60 includes a deposition step and a planarization step to remove the excess deposited material over gate spacers 32 and ILD 42. Hard mask 60 may be formed of silicon nitride, for example.

Figure 13B:
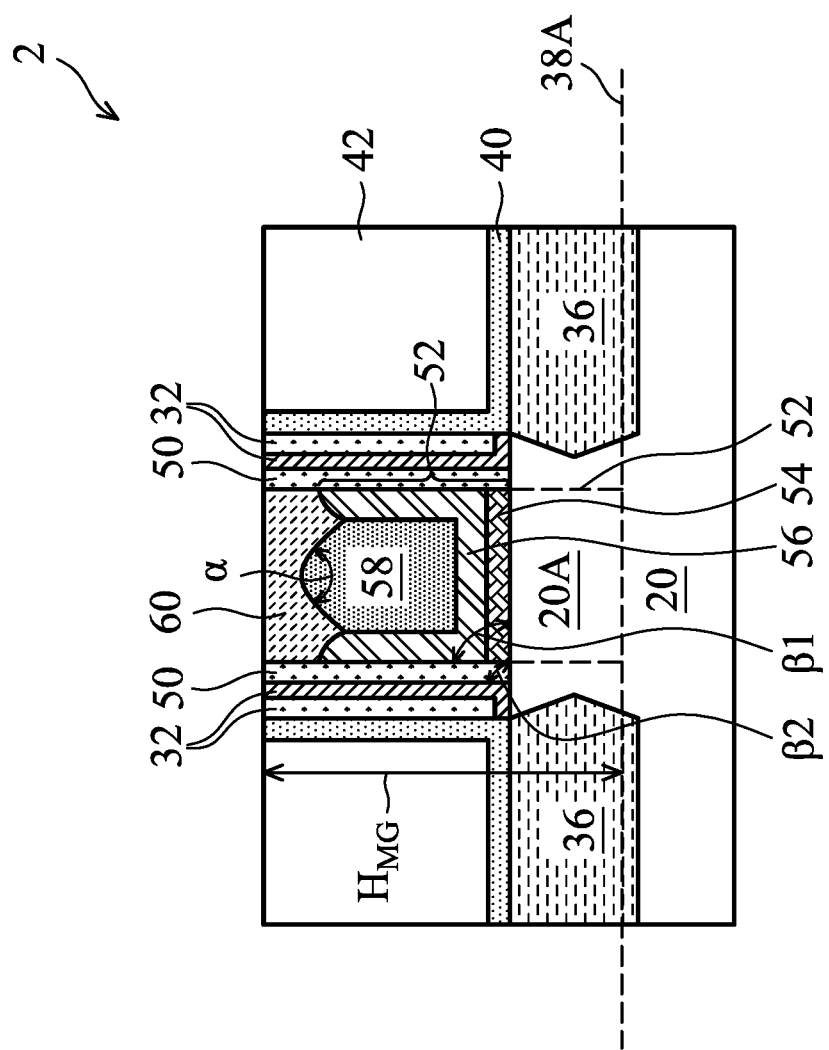

FIG. 13B schematically illustrates the profile of the metal gate physically formed on a wafer. It is observed that replacement gate electrode 58 may have a profile with a middle portion protruding above edge portions. The top surface thus form angle α in the cross-sectional view as shown in FIG. 13B. Replacement gate electrode 58 may have a curved top surface, with a middle portion of the curved top surface protruding above edge portions. In an embodiment, high-k gate dielectric 56 may have a continuously curved or sloping top surface. In an embodiment, high-k gate dielectric 56 may have a convex top surface that curves continuously from a first sidewall of the high-k gate dielectric 56 to a second sidewall of the high-k gate dielectric 56. High-k gate dielectric 56 may directly contact gate spacers 50 at higher points than points at which high-k gate dielectric 56 contacts replacement gate electrode 58. As discussed in preceding paragraphs, the illustrated transistor may represent a standard transistor, an HV transistor, a long-channel transistor, and an IO transistor. Due to different widths of the gate electrode, the profile of these transistors may be different from each other. For example, assuming when the illustrated transistor is a standard transistor, an HV transistor, a long-channel transistor, or an IO transistor, the angle α is equal to α1, α2, α3, or α4, respectively, then ratio α1:α2:α3:α4 may be in the range 1.0:1.7~1.8:1.9~2.0:2.0~2.1.

The height $H_{MG}$ of gate stack 52 is measured from the top of hard mask 60 to top surface 38A of the STI regions 38 (FIG. 5B), Assuming when the illustrated transistor is a standard transistor, an HV transistor, a long-channel transistor, or an IO transistor, the height $H_{MG}$ is equal to height $H_{MG1}$, $H_{MG2}$, $H_{MG3}$, or height $H_{MG4}$, respectively, then ratio $H_{MG1}$:$H_{MG2}$:$H_{MG2}$:$H_{MG3}$:$H_{MG4}$ may be in the range 1.0:1.0~1.1:0.91.0:1.0~1.1.

The volume V of gate stack 52 may be represented as V1, V2, V3, or V4 when the illustrated transistor is a standard transistor, an HV transistor, a long-channel transistor, or an IO transistor, respectively. In accordance with some embodiments of the present disclosure, ratio V1:V2:V3:V4 may be in the range 1.0:0.9~0.98:30~38:42~48.

The tilt angle β1 of the sidewall of gate spacers 55 may be smaller than about 89 degrees, and tilt angle β2 of the sidewall of gate spacers 32 may also be smaller than about 89 degrees. In accordance with some embodiments of the present disclosure, the edges of gate stack 52 are substantially straight, and hence tilt angles β1 and β2 are close to 90 degrees.

Figure 14:
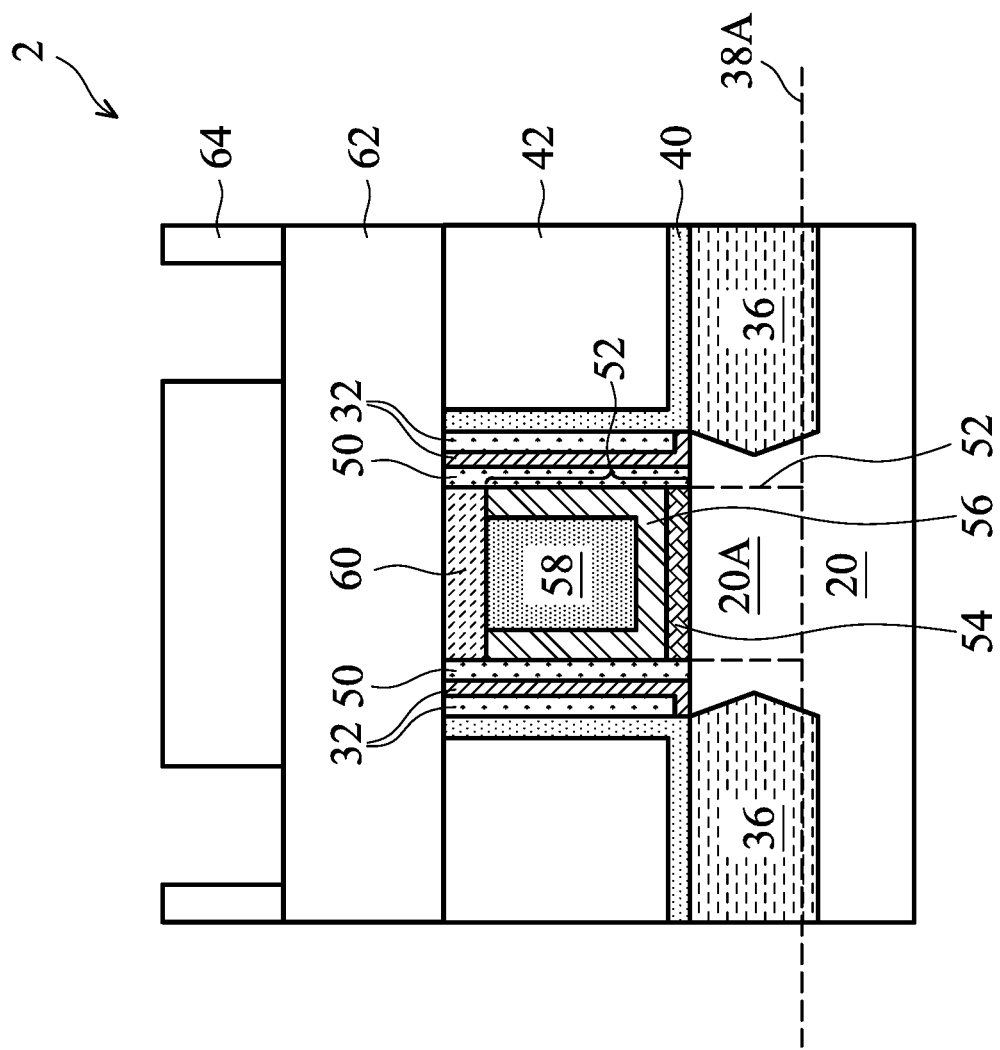
Figure 15:
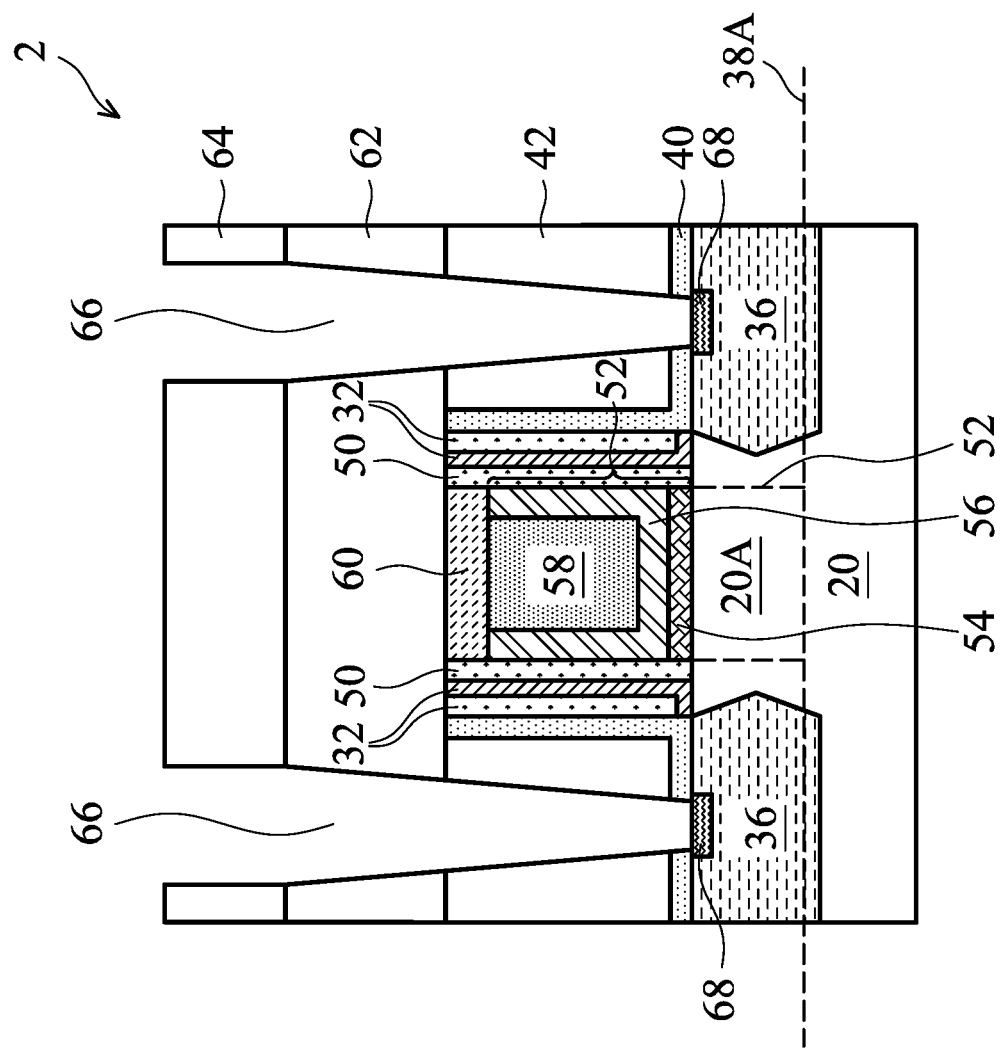
Figure 16:
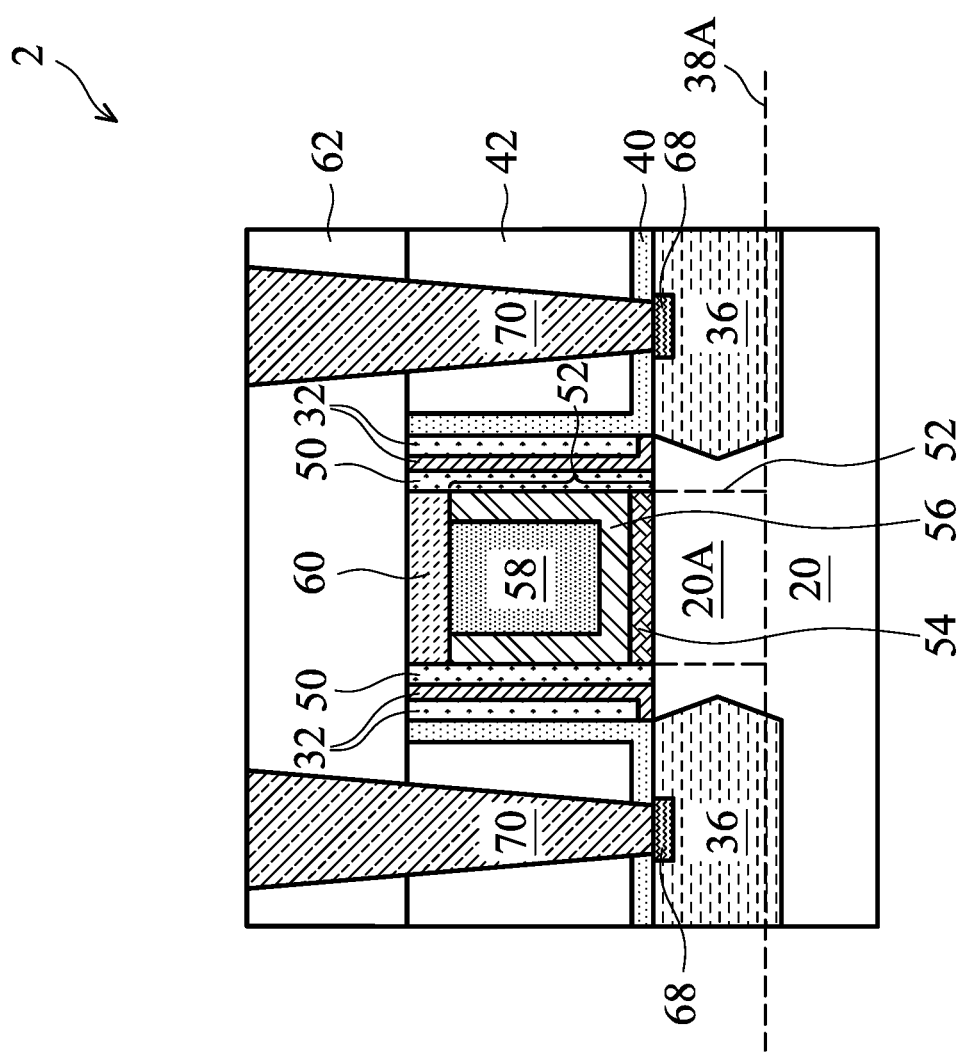

FIGS. 14 through 16 illustrate the formation of lower source/drain contact plugs. The respective step is illustrated as steps 518 in the process flow shown in FIG. 24. Referring to FIG. 14, sacrificial dielectric layer 62 is formed, followed by the application of patterned photo resist 64. Sacrificial dielectric layer 62 is formed of a dielectric material different from the material of ILD 42. For example, sacrificial dielectric layer 62 may be formed of a dielectric material selected from the same candidate dielectric materials for forming ILD 42, while they are still formed of different materials. Next, as shown in FIG. 15, sacrificial dielectric layer 62, ILD 42, and CESL 40 are etched to form contact openings 66. Source/drain silicide regions 68 are then formed, for example, through a self-aligned silicidation process. It is appreciated that source/drain contact openings 66 may be formed in a single lithography process, or may be formed in a double patterning process using two lithographs processes, wherein the pattern of the source/drain contact opening 66 on the left side of replacement gate stack 52 is in a first lithography mask, and the pattern of the source/drain contact opening 66 on the right side of replacement gate stack 52 is in a second lithography mask. Photo resist 64 is then removed.

Referring to FIG. 16, contact openings 66 are filled with a conductive material(s), followed by a planarization process, hence forming source/drain contact plugs 70. In accordance with some embodiments, source/drain contact plugs 70 include a conductive barrier layer formed of titanium, titanium nitride, tantalum, or tantalum nitride, and a metal such as tungsten, aluminum, copper, or the like over the diffusion barrier layer. In accordance with alternative embodiments, contact plugs 70 are formed of a single layer formed of a homogenous material such as tungsten or an alloy.

Figure 17:
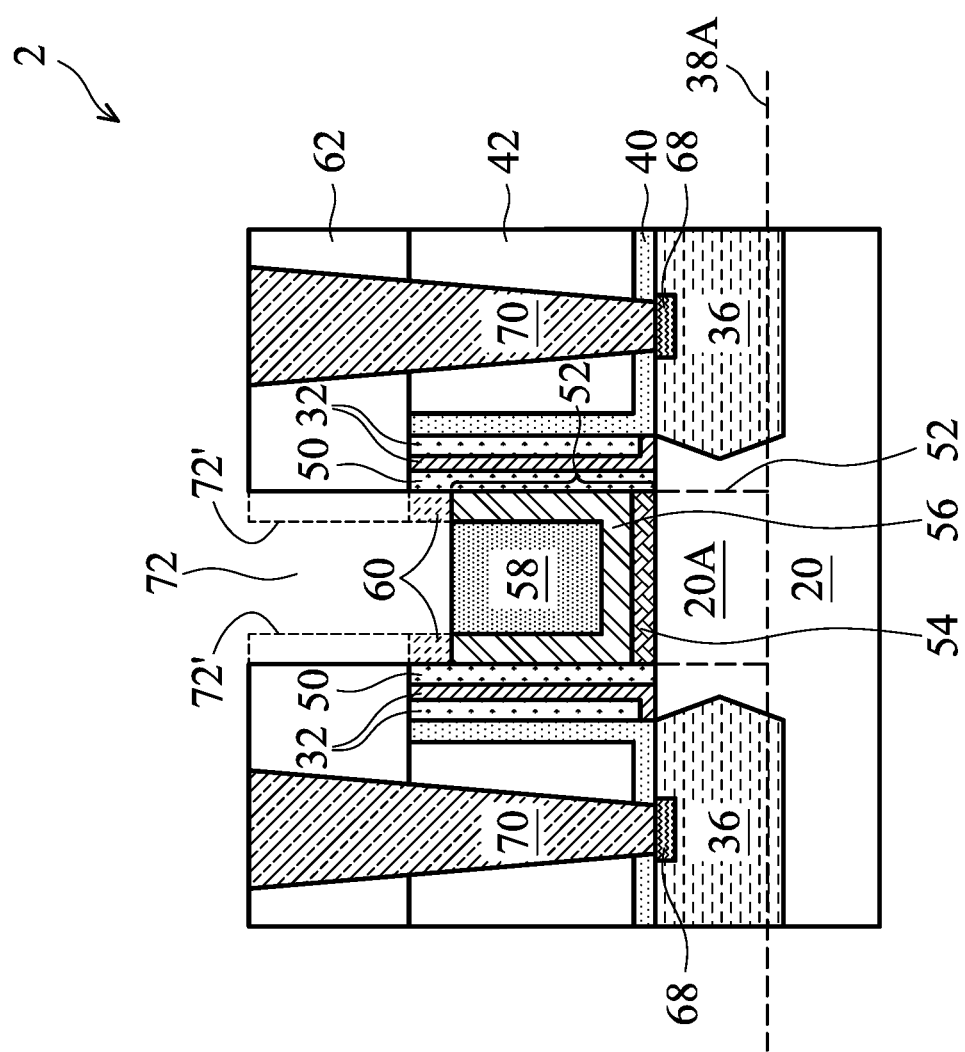
Figure 18:
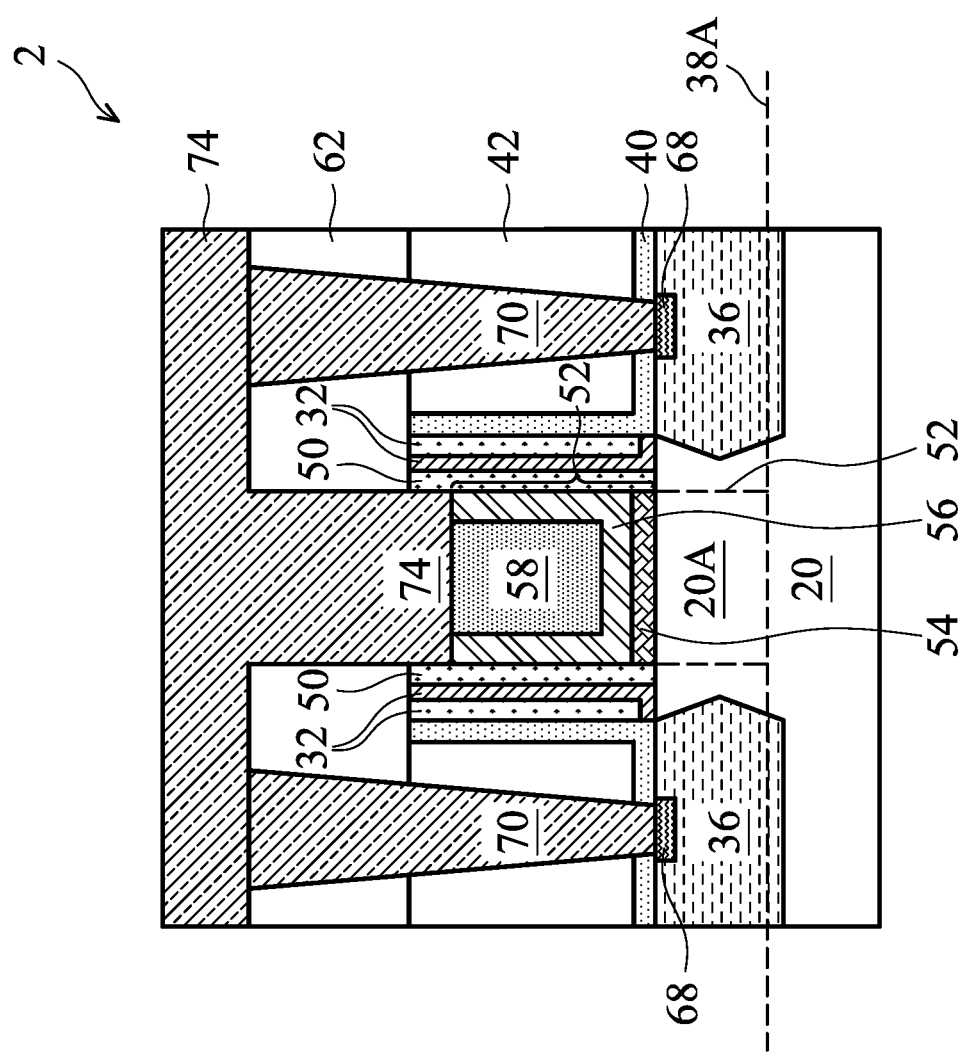
Figure 19:
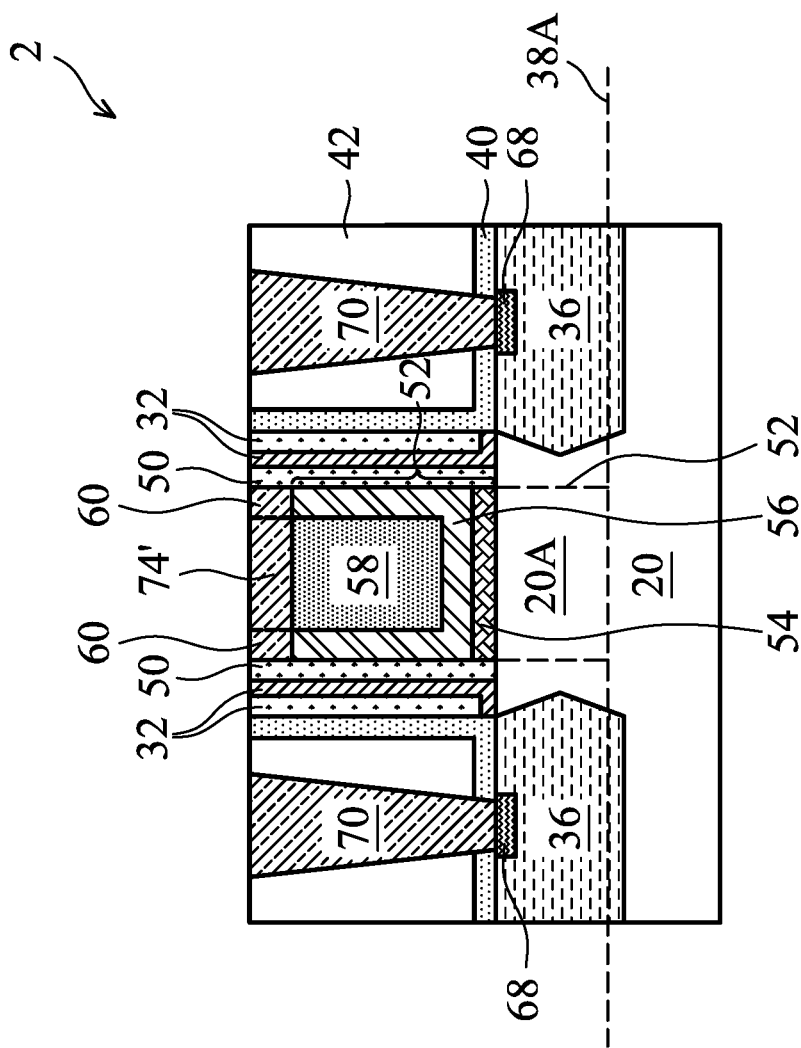

FIGS. 17 through 19 illustrate the formation of a gate contact plug. The respective step is illustrated as step 520 in the process flow shown in FIG. 24. Referring to FIG. 17, a photo lithography process is performed using a lithography mask (not shown) to etch-through sacrificial dielectric layer 62. Hard mask 60 is then removed, forming opening 72. In accordance with some embodiments of the present disclosure, the formation of opening 72 includes an anisotropic etching to etch through sacrificial dielectric layer 62, and an isotropic etching (dry or wet) to remove hard mask 60. The sidewalls of gate spacers 50 are thus exposed. In the embodiments in which gate spacers 50 are not formed, the sidewalls of gate spacers 32 are exposed to opening 72. The etchant for etching sacrificial dielectric layer 62 and hard mask 60 are selected, so that gate spacers 50 and 32 are substantially not etched. In accordance with alternative embodiments of the present disclosure, opening 72 is narrower than hard mask 60, and hence some edge portions of hard mask 60 are left, wherein the corresponding opening 72 and hard mask 60 are illustrated using dashed lines 72'.

Referring to FIG. 18, a conductive material 74 is deposited, wherein a single layer or a composite layer (including a plurality of conductive layers) is formed. The material and the structure of gate contact plug 74 may be selected from the same candidate materials and structures of contact plugs 70. Next, a planarization step such as CMP is performed to remove sacrificial dielectric layer 62 and the portions of the conductive material 70 inside and over sacrificial dielectric layer 62. Accordingly, gate contact plug 74, is formed, as shown in FIG. 19. Source/drain contact plugs 70 are also lowered.

Gate contact plug 74' and source/drain contact plugs 70 have top surfaces substantially coplanar with the top surfaces of gate spacers 32 and ILD 42. Furthermore, gate spacers 50 (or 32 if gate spacers 50 are not formed) extend to contact the sidewalls of gate contact plug 74'. Alternatively stated, the sidewalls of gate contact plug 74' and the sidewalls of gate stack 52 are contact with the same sidewalls of the respective gate spacers 50 (or 32) in accordance with some embodiments. Gate spacers 50 and 32 thus separate gate contact plug 74' from source/drain contact plugs 70. The addition of gate spacers 50 advantageously reduces the possibility of the leakage or the electrical shorting between gate contact plug 74' and source/drain contact plugs 70.

In accordance with alternative embodiments in which hard mask 60 are not fully removed, gate contact plug 74' is separated from one or both gate spacers 32 by remaining portion(s) of hard mask 60, wherein the top surface of hard mask 60 is also coplanar with the top surfaces of gate spacers 32 and ILD 42. The dashed lines illustrate the sidewalls of gate contact plug 74' in accordance with these embodiments.

Figure 20:
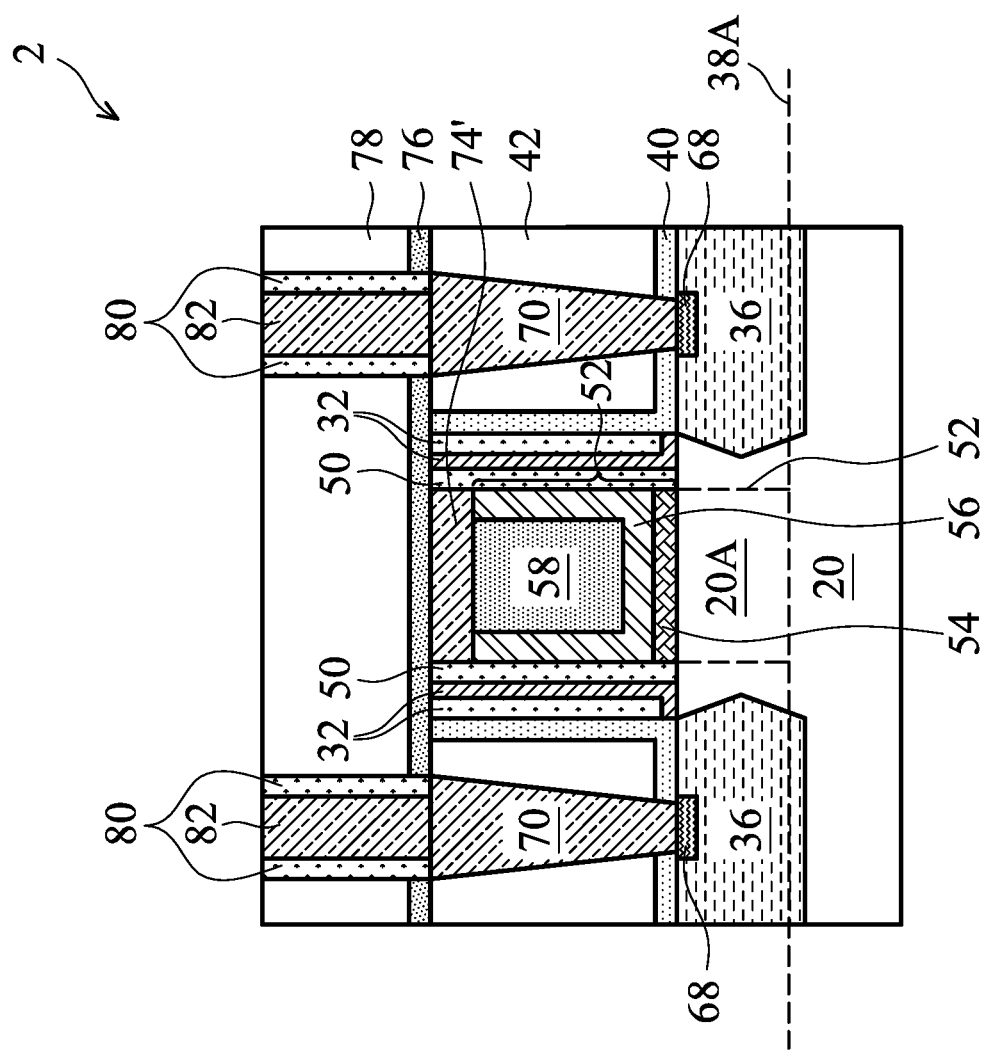

FIG. 20 illustrates the formation of etch stop layer 76, ILD 78, and source/drain contact plugs 82 in etch stop layer 76 and ILD 78. Etch stop layer 76 may comprise silicon carbide, silicon oxynitride, silicon carbo-nitride, or the like. ILD 78 may include a material selected from PSG, BSG, BPSG, Fluorine-doped Silicon Glass (FSG), TEOS, or other non-porous low-k dielectric materials. Etch stop layer 76 may be formed using a deposition method such as CVD. ILD 78 may be formed using spin coating, Flowable Chemical Vapor Deposition (FCVD), or the like, or formed using a deposition method such as Plasma Enhanced Chemical Vapor Deposition (PECVD), Low Pressure Chemical Vapor Deposition (LPCVD), or the like.

ILD 78 and etch stop layer 76 are etched to form openings (occupied by 82 and 80). The etching may be performed using, for example, Reactive Ion Etch (RIE). In a subsequent step, contact spacers 80 are formed. Contact spacers 80 may be formed of a dielectric material selected from SiN, SiON, SiCN, SiOCN, AlON, AlN, combinations thereof, and/or multi-layers thereof. The formation method may be essentially the same as the formation of gate spacers 50, which includes a blanket deposition and an anisotropic etching. Contact plugs 82 are then formed, for example, through a deposition and a planarization. The respective step is illustrated as step 522 in the process flow shown in FIG. 24.

Figure 21:
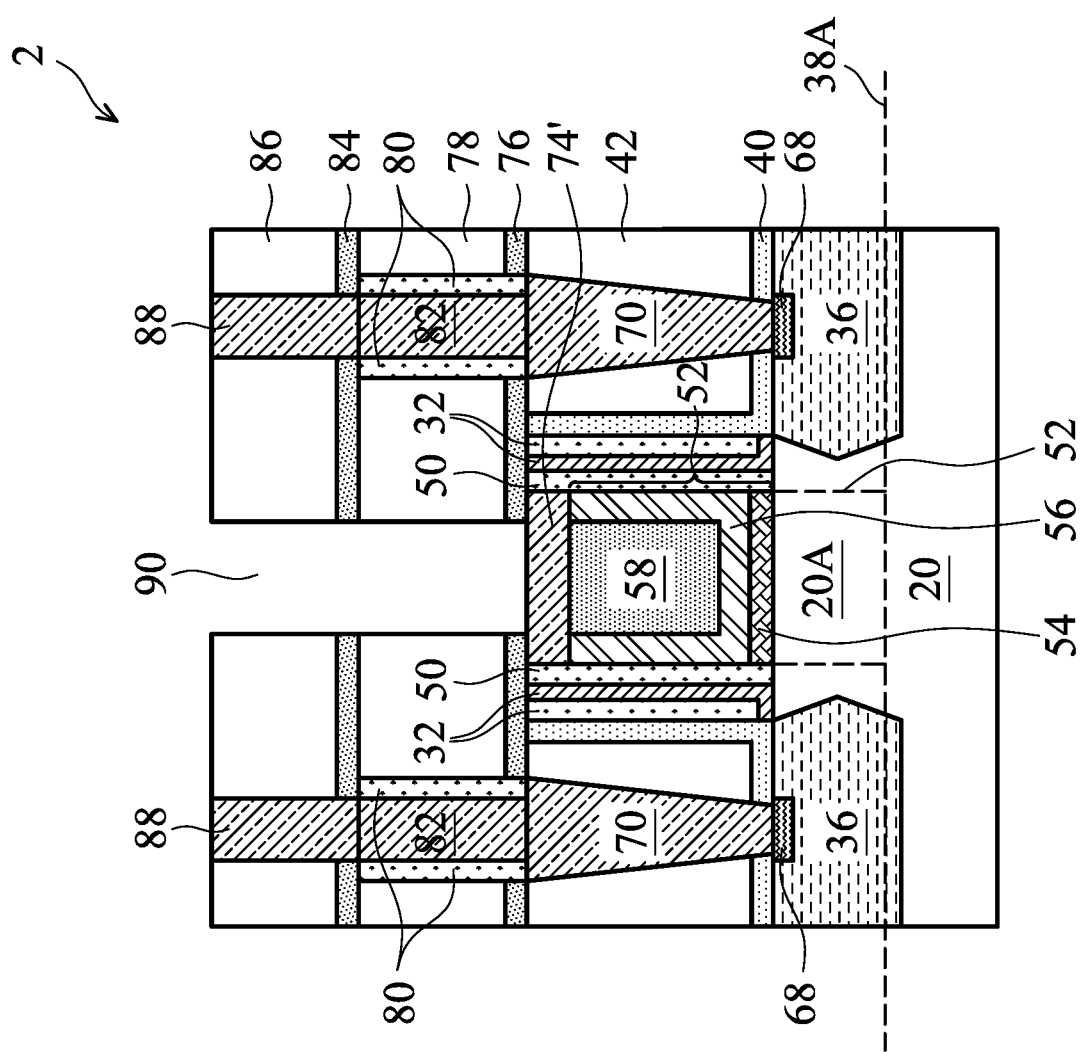

FIG. 21 illustrates the formation of etch stop layer 84, dielectric layer 86, conductive vias 88, and via openings 90. Etch stop layer 84 and dielectric layer 86 may be formed using similar (or different) materials and similar methods as etch stop layer 76 and ILD 78, respectively. Vias 88 may include a barrier layer formed of titanium, titanium nitride, tantalum, or tantalum nitride, and a conductive material such as copper, tungsten, or the like over the barrier layer. Opening 90 is formed by etching layers 76, 78, 84 and 86.

Figure 22:
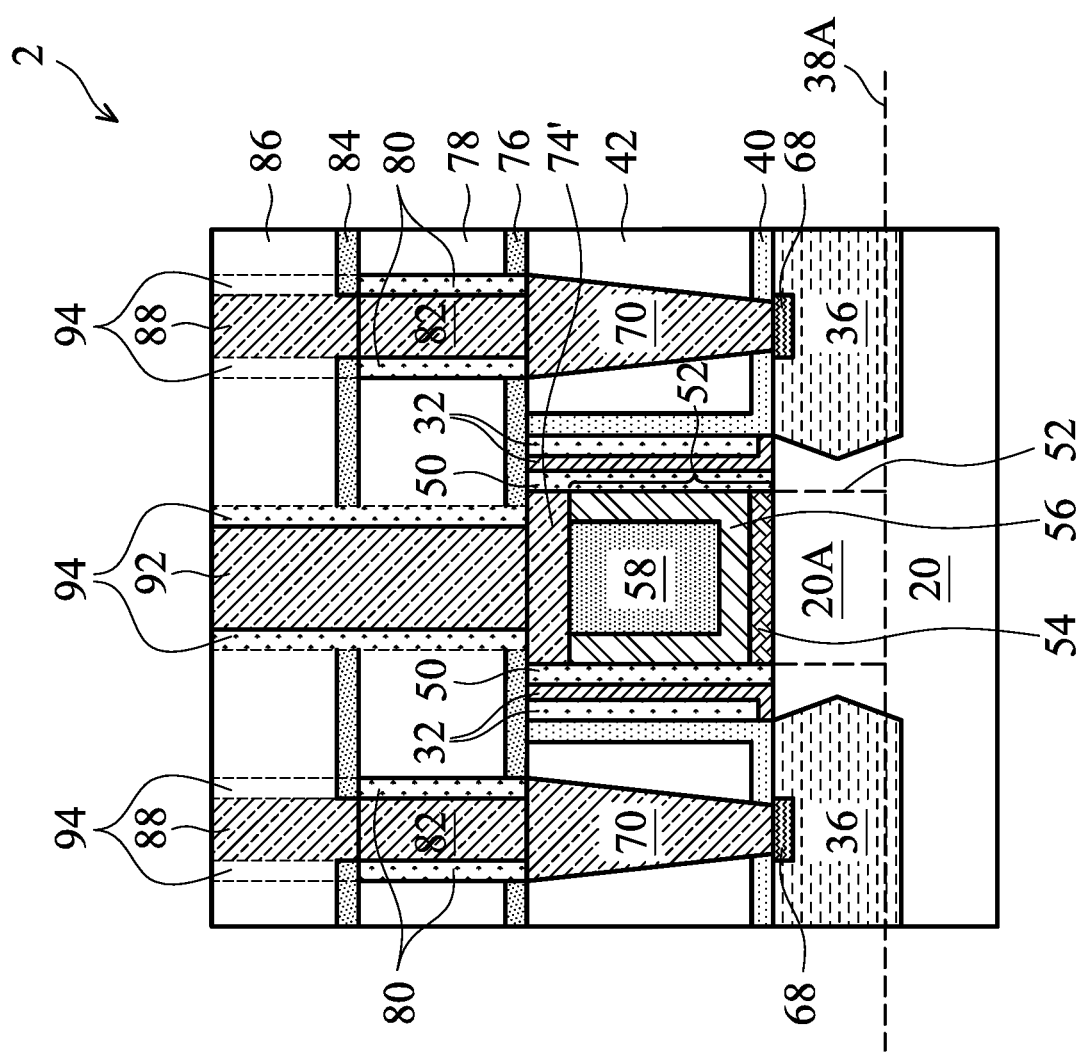
Figure 23:
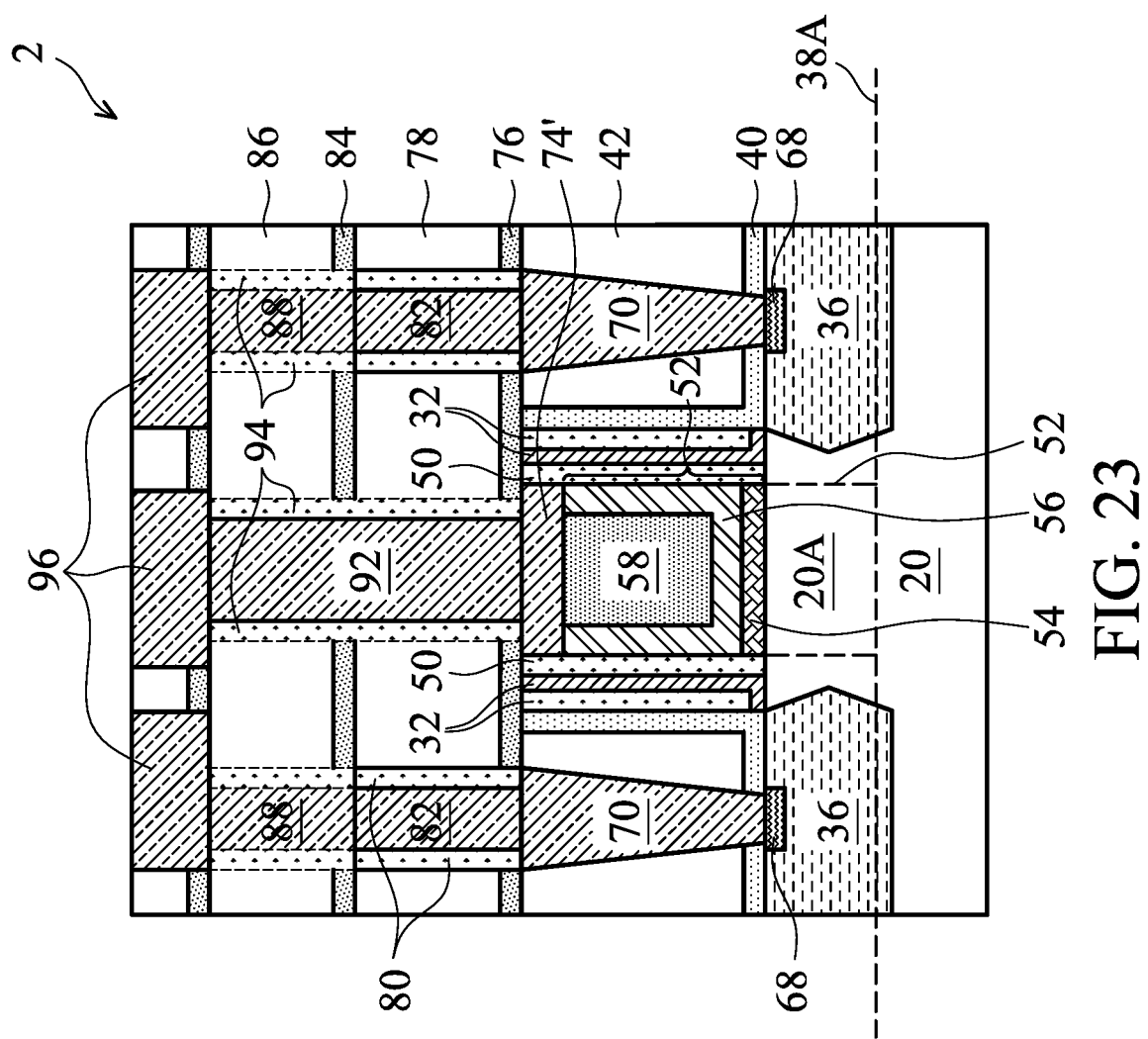
Figure 24:
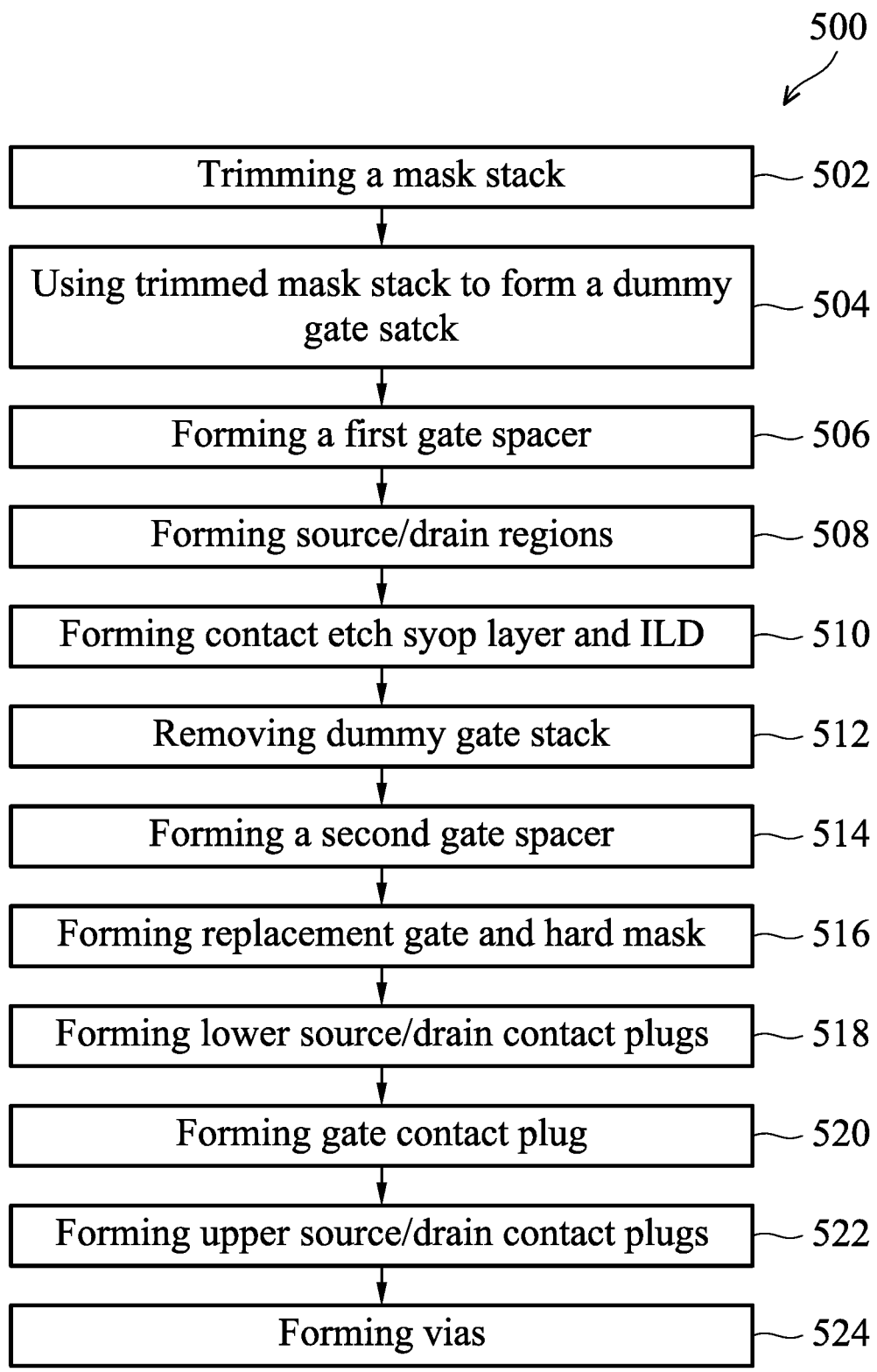
FIG. 24 illustrates a process flow for forming a transistor in accordance with some embodiments.

Next, opening 90 is filled to form via 92, as shown in FIG. 22, which may be formed of similar material as vias 88. The respective step is illustrated as step 524 in the process flow shown in FIG. 24. Via spacers 94 may be formed on the sidewalls of vias 88 and/or 90 for reducing leakage or electrical short. FIG. 23 illustrates the formation of bottom metallization layer, which includes metal lines 96.

The embodiments of the present application have some advantageous features. Through the trimming of mask stacks, the widths of some transistors are reduced, and the sizes of the corresponding transistors are reduced. The etch-through of dummy gate dielectric reduces the possibility of electrical shorting and leakage caused by the undercut formed under gate spacers. The formation of additional gate spacers in the recess left by dummy gate stack advantageously reduces the electrical shorting and leakage also. The etching of dummy gate electrode using radicals results in a better removal without leaving residue. Furthermore, the formation of contact spacers also reduces the leakage and the possibility of shorting between gate contact plug and source/drain contact plugs.

In accordance with some embodiments of the present disclosure, a method includes forming a dummy gate stack over a semiconductor region, forming a gate spacer on a sidewall of the dummy gate stack, removing the dummy gate stack to form an opening, forming a replacement gate stack in the opening, recessing the replacement gate stack to form a recess, filling the recess with a conductive material, and performing a planarization to remove excess portions of the conductive material over the gate spacer. A remaining portion of the conductive material forms a gate contact plug. A top portion of the gate contact plug is at a same level as a top portion of the first gate spacer.

In accordance with some embodiments of the present disclosure, a method includes forming a dummy gate stack on a top surface and a sidewall of a semiconductor fin, forming gate spacers having sidewalls contacting sidewalls of the dummy gate stack, forming a source/drain region on a side of the dummy gate stack, forming an inter-layer dielectric to cover the source/drain region, removing the dummy gate stack to form an opening between the gate spacers, filling a bottom portion of the opening with a replacement gate stack, and forming a gate contact plug to fill a top portion of the opening. The gate contact plug is between top portions of the gate spacers.

In accordance with some embodiments of the present disclosure, a device includes a semiconductor region, a gate stack over the semiconductor region, a source/drain region on a side of the gate stack, and a first gate spacer and a second gate spacer on sidewalls of the gate stack. A gate contact plug is over the gate stack, and the gate contact plug is between the first gate spacer and the second gate spacer, with top portions of the first gate spacer and the second gate spacer being at a same level as the gate contact plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor substrate;
   isolation regions extending into the semiconductor substrate;
   a semiconductor region protruding higher than top surfaces of the isolation regions;
   a gate stack on a sidewall and a top surface of the semiconductor region, wherein an entirety of a topmost surface of the gate stack is curved, wherein the gate stack comprises:
   an interfacial dielectric layer;
   a gate dielectric; and
   a gate electrode over the gate dielectric, the gate electrode having a curved top surface, wherein a center portion of the top surface of the gate electrode protrudes above edge portions of the curved top surface of the gate electrode;
   a source/drain region on a side of the gate stack;
   a first gate spacer and a second gate spacer on opposite sidewalls of the gate stack, wherein the first gate spacer and the second gate spacer contact the gate stack, wherein the gate dielectric contacts the first gate spacer at a first point higher than a second point where the gate dielectric contacts the gate electrode, wherein the gate dielectric has a first sidewall that contacts the first gate spacer and a second sidewall that contacts the gate electrode, wherein a topmost point of the first sidewall is higher than a topmost point of the second sidewall, wherein the topmost point of the first sidewall is the highest point at which the gate dielectric directly contacts the first gate spacer, wherein the curved top surface of the gate electrode contacts the topmost point of the second sidewall, wherein the center portion of the curved top surface of the gate electrode is higher than the topmost point of the first sidewall and the topmost point of the second sidewall;
   a third gate spacer and a fourth gate spacer, with the first and the second gate spacers between the third gate spacer and the fourth gate spacer, wherein the third gate spacer contacts the first gate spacer, and wherein the first gate spacer, the second gate spacer, the third gate spacer and the fourth gate spacer physically contact the top surface of the semiconductor region; and
a fifth gate spacer and a sixth gate spacer, with the third and the fourth gate spacers between the fifth gate spacer and the sixth gate spacer, wherein the fifth gate spacer contacts the third gate spacer, wherein the first gate spacer, third gate spacer, and fifth gate spacer comprise materials that are different from each other, wherein a first interface between the interfacial dielectric layer and the gate dielectric is higher than a second interface between the third gate spacer and the fifth gate spacer.

2. The device of claim 1 further comprising a gate contact plug over the gate stack, wherein the gate contact plug is between the first gate spacer and the second gate spacer, with top portions of the first gate spacer and the second gate spacer being at a same level as the gate contact plug, wherein the gate contact plug is in contact with sidewalls of the first gate spacer and the second gate spacer.

3. The device of claim 1, wherein top surfaces of the first gate spacer, the third gate spacer and the fifth gate spacer are at a same level.

4. The device of claim 1 further comprising:
a first source/drain contact plug over and electrically coupled to the source/drain region, wherein the first source/drain contact plug comprises a top surface substantially level with top surfaces of the first gate spacer and the second gate spacer; and
an etch stop layer over the first source/drain contact plug and the gate contact plug.

5. The device of claim 4 further comprising:
a dielectric layer over the etch stop layer;
a second source/drain contact plug over and contacting the first source/drain contact plug, wherein the second source/drain contact plug is in the etch stop layer and the dielectric layer; and
a dielectric contact spacer encircling and contacting the second source/drain contact plug.

6. The device of claim 1, wherein the third gate spacer comprises a first layer having an L-shape.

7. The device of claim 1, wherein a sidewall of the gate contact plug is vertically aligned to a sidewall of the gate stack in a cross-sectional view of the device.

8. A device comprising:
a semiconductor substrate;
isolation regions extending into the semiconductor substrate;
a semiconductor fin protruding higher than top surfaces of the isolation regions;
a gate stack on a sidewall and a top surface of the semiconductor fin, wherein an entirety of a topmost surface of the gate stack is curved, wherein the gate stack comprises:
an interfacial dielectric layer;
a gate dielectric, wherein the gate dielectric has a first sidewall and a second sidewall; and
a gate electrode, the gate electrode having a curved top surface, wherein a middle portion of the curved top surface of the gate electrode protrudes above edge portions of the curved top surface of the gate electrode, wherein the curved top surface of the gate electrode contacts a topmost point of the first sidewall;
a first gate spacer on a sidewall of the gate stack, wherein the first gate spacer contacts the second sidewall, wherein a topmost point of the second sidewall is higher than the topmost point of the first sidewall, wherein the gate dielectric has a curved top surface that curves continuously from the topmost point of the first sidewall to the topmost point of the second sidewall;
a second gate spacer between and in contact with the first gate spacer and a third gate spacer, wherein the first gate spacer and the second gate spacer physically contact the top surface of the semiconductor fin, wherein the second gate spacer and the third gate spacer each comprise a first element, wherein a percentage of the first element in the second spacer is different than a percentage of the first element in the third spacer, wherein a first interface between the interfacial dielectric layer and the gate dielectric is higher than a second interface between the second gate spacer and the third gate spacer;
a dielectric hard mask overlapping the gate dielectric; and
a dielectric layer over and in contact with top surfaces of the first gate spacer, the second gate spacer, the third gate spacer, the dielectric hard mask, and a first gate contact plug.

9. The device of claim 8 further comprising the first gate contact plug over and contacting the gate electrode, wherein a top surface of the first gate contact plug is level with a top surface of the first gate spacer, the second gate spacer, and the third gate spacer.

10. The device of claim 8, wherein the dielectric layer is an etch stop layer, and the device further comprises:
a first inter-layer dielectric over the etch stop layer;
a second inter-layer dielectric over the first inter-layer dielectric;
a first source/drain contact plug in the first inter-layer dielectric;
a second source/drain contact plug in the second inter-layer dielectric, wherein the second source/drain contact plug is over and contacting the first source/drain contact plug; and
a second gate contact plug penetrating through both the first inter-layer dielectric and the second inter-layer dielectric.

11. The device of claim 10 further comprising a dielectric contact spacer encircling the second gate contact plug, wherein the dielectric contact spacer penetrates through both the first inter-layer dielectric and the second inter-layer dielectric.

12. The device of claim 10 further comprising a dielectric contact spacer encircling the first source/drain contact plug.

13. The device of claim 10 further comprising a dielectric contact spacer encircling the second source/drain contact plug.

14. The device of claim 8, wherein the first gate contact plug comprises a side edge in contact with a side edge of the dielectric hard mask.

15. The device of claim 8, wherein a bottom surface of the interfacial dielectric layer is in contact with the semiconductor fin and the gate dielectric has sidewall portions higher than, and connected to opposite ends of the interfacial dielectric layer.

16. The device of claim 8 further comprising an additional inter-layer dielectric, with the gate stack and the first gate spacer in the additional inter-layer dielectric, wherein a top surface of the additional inter-layer dielectric is further in contact with the dielectric layer.

17. A device comprising:
a semiconductor substrate;
isolation regions extending into the semiconductor substrate;

a semiconductor fin protruding higher than top surfaces of the isolation regions;
a gate stack on a sidewall and a top surface of the semiconductor fin, wherein a topmost surface of the gate stack comprises multiple curves, wherein the gate stack comprises:
an interfacial dielectric layer;
a gate dielectric, wherein the gate dielectric has a top surface that is curved, wherein the gate dielectric has a first sidewall and a second sidewall, the curved top surface of the gate dielectric being convex and curves continuously from the first sidewall to the second sidewall; and
a gate electrode, a middle portion of a top surface of the gate electrode protruding above edge portions of the top surface of the gate electrode, wherein the top surface of the gate electrode is curved, wherein the gate electrode contacts the first sidewall;
a first gate spacer comprising a first portion and a second portion contacting opposite sidewalls of the gate stack, wherein the second portion of the first gate spacer contacts the second sidewall, wherein a topmost point of the second sidewall is higher than a topmost point of the first sidewall and lower than a topmost point of the middle portion of the top surface of the gate electrode;
a second gate spacer comprising a first portion and a second portion contacting the first portion and the second portion of the first gate spacer respectively, wherein the first portion and the second portion of the first gate spacer and the first portion and the second portion of the second gate spacer physically contact the top surface of the semiconductor fin; and
a third gate spacer comprising a first portion and a second portion contacting the first portion and the second portion of the second gate spacer respectively, wherein the first gate spacer, the second gate spacer, and the third gate spacer comprise materials that are different from each other, wherein a first interface between the interfacial dielectric layer and the gate dielectric is higher than a second interface between the first portion of the second gate spacer and the first portion of the third gate spacer.

18. The device of claim 17 further comprising:
a first gate contact plug over the gate stack, with a top surface of the first gate contact plug being substantially coplanar with a top surface of the first gate spacer, wherein opposite side edges of the first gate contact plug contact side edges of the first portion and the second portion of the first gate spacer;
a second gate contact plug over and contacting the first gate contact plug; and
a contact spacer comprising portions contacting opposite sidewalls of the second gate contact plug.

19. The device of claim 18, wherein a bottom surface of the contact spacer contacts a top surface of the first gate contact plug.

20. The device of claim 17 further comprising an etch stop layer, with a bottom surface of the etch stop layer contacting both the top surface of the first gate contact plug and the top surface of the first gate spacer.

* * * * *